US010558770B1

(12) United States Patent
Kanthasamy et al.

(10) Patent No.: US 10,558,770 B1
(45) Date of Patent: Feb. 11, 2020

(54) FINITE ELEMENT BASED DIRECT MODELING

(71) Applicant: MSC.Software Corporation, Newport Beach, CA (US)

(72) Inventors: Kunaseelan Kanthasamy, Irvine, CA (US); Douglas Brennan, Newport Beach, CA (US); Michel Samah, San Diego, CA (US); James Harvey Leedom, Columbus, NJ (US)

(73) Assignee: MSC.SOFTWARE CORPORATION, Newport Beach, CA (US)

( * ) Notice: Subject to any disclaimer, the term of this patent is extended or adjusted under 35 U.S.C. 154(b) by 0 days.

(21) Appl. No.: 14/738,616

(22) Filed: Jun. 12, 2015

(51) Int. Cl.
*G06F 17/50* (2006.01)
*G06T 17/20* (2006.01)
*G06T 19/20* (2011.01)

(52) U.S. Cl.
CPC .......... *G06F 17/5018* (2013.01); *G06T 17/20* (2013.01); *G06T 19/20* (2013.01)

(58) Field of Classification Search
CPC ......... G06T 17/20; G06T 19/20; G06F 17/50; G06F 17/5018; G06F 17/5009; G06F 2217/16
See application file for complete search history.

(56) References Cited

U.S. PATENT DOCUMENTS

| | | | | |
|---|---|---|---|---|
| 2004/0210429 A1* | 10/2004 | Yu | ...... | B29C 45/7693 703/9 |
| 2006/0017723 A1* | 1/2006 | Baran | ...... | G06T 17/30 345/419 |
| 2010/0161297 A1* | 6/2010 | Muller-Fischer | ...... | G06F 17/5009 703/6 |
| 2013/0271459 A1* | 10/2013 | Gary | ...... | G06T 15/20 345/420 |
| 2013/0275088 A1* | 10/2013 | Gary | ...... | G06F 17/50 703/1 |
| 2015/0339851 A1* | 11/2015 | Date | ...... | G06T 17/205 345/420 |

OTHER PUBLICATIONS

Abaqus 6.14 Abaqus/CAE User's Guide, Dassault Systèmes, URL: http://abaqus.software.polimi.it/v6.14/pdf_books/CAE.pdf, 2014, total 1146 pages.*
Roberts, Laura M., "Use of manual adaptive remeshing in the mechanical modeling of an intraneural ganglion cyst", Master's report, Michigan Technological University, 2012, URL: http://digitalcommons.mtu.edu/etds/565, total 81 pages.*
Soman, Puneet, "Mechanical modeling of Intraneural Ganglion Cyst", Master's Thesis, Michigan Technological University, 2012, URL: http://digitalcommons.mtu.edu/etds/410, total 106 pages.*

(Continued)

*Primary Examiner* — Phuc N Doan
(74) *Attorney, Agent, or Firm* — Foley & Lardner LLP

(57) ABSTRACT

Systems and methods are described herein for enabling direct modeling for a mesh model, including, but not limited to, obtaining a mesh model of a physical object, the mesh model comprising a plurality of elements, determining at least one feature associated with at least some of the plurality of elements of the mesh model, and manipulating the plurality of elements of the mesh model by manipulating the at least one feature.

19 Claims, 31 Drawing Sheets

(56) References Cited

OTHER PUBLICATIONS

Rsvmilleraprilia, Finite Element Analysis of Nanoidentation, https://www.youtube.com/watch?v=C2U1Y0bgyus (Year: 2011).*

Fletcher, QuickRopes2 Generalized Tutorial, URL: https://www.youtube.com/watch?v=PxGzh1EULcg, Apr. 2013 (Year: 2013).*

Lipp, PushPull++, URL: http://peterwonka.net/Publications/pdfs/2014.SG.Lipp.PushPull.pdf (Year: 2014).*

Abaqus, V6.12, Section 3.8 Creating geometry from orphan elements, URL: http://media.3ds.com/support/simulia/public/v612/release-notes/books/rnb/default.htm?startat=abc03aqs08.html (Year: 2012).*

Agrawa, IGA: A Simplified Introduction and Implementation Details for Finite Element Users, J. Inst. Eng. India, May 2018, pp. 561-585 (Year: 2018).* http://dsk.ippt.pan.pl/docs/abaqus/v6.13/books/usi/default.htm?startat=pt06ch65s04hlb01.html.

\* cited by examiner

FINITE ELEMENT BASED DIRECT MODELING

BACKGROUND OF THE INVENTION

1. Field

The present disclosure relates generally to the field of Finite Element Method (FEM) and Finite Element Analysis (FEA), and more specifically, to providing direct modeling to for the FEM and FEA.

2. Background

Direct modeling is a modeling method used for various Computer-Aided Design (CAD) modeling approaches. Direct modeling allows a user to manipulate a geometry of a model (e.g., a CAD model) of a physical object by directly interacting with the geometric features of the model. For example, direct modeling may enable the user to push, pull, or drag geometric features with a user interface from one position to another position. The user may additionally be enabled to manipulate the geometric features in other manners such as, but not limited to, resize or reorient the geometric features, via the user interface. Geometric features may be any suitable geometric component of the geometric model.

In conventional cases, direct modeling may be limited to CAD-based geometric models. This is because CAD-based geometric models are associated with distinct or divisible geometric features that can be interacted or manipulated with a user interface. On the other hand, FEM and FEA are concerned with a finite number of subdivisions (e.g., elements in a mesh) such that readily-definable geometric features, may not be enabled or immediately ascertainable.

SUMMARY OF THE INVENTION

Embodiments described herein relate to systems and methods for providing direct modeling tools for Finite Element Method (FEM) and Finite Element Analysis (FEA). In general terms, a mesh model may be imported. The mesh model may be orphaned from geometry and include a plurality of elements (subdivisions). Features may be defined according to suitable rules based on criteria such as an angle between surfaces of two adjacent elements. User input may be received from a user via a user interface for manipulating the features. For example, the user may reposition, resize, reorient, and/or reshape the defined features. In other words, the user may interact with both the elements and the features associated with the elements with the same user interface.

A method is described herein for enabling direct modeling for a mesh model, including obtaining a mesh model of a physical object, the mesh model including a plurality of elements, determining at least one feature associated with at least some of the plurality of elements of the mesh model, and manipulating the plurality of elements of the mesh model by manipulating the at least one feature.

In some embodiments, the manipulating of the at least one feature includes at least one of virtually pushing or pulling the at least one feature.

In some embodiments, the manipulating the at least one feature includes at least one of virtually reorienting, repositioning, resizing, performing Boolean operations, or filling the at least one feature.

In some embodiments, the mesh model includes a plurality of elements. Each feature is associated with at least one of the plurality of elements.

In some embodiments, the mesh model is an orphan mesh model.

IN various embodiments, the mesh model is a model without a non-uniform rational basis spline (NURBS).

In various embodiments, the method further includes displaying the features associated with the mesh model via a user interface to a user.

In some embodiments, the method further includes displaying the features associated with the mesh model and the plurality of elements simultaneously via a user interface to a user.

According to some embodiments, the determining of the at least one feature includes identifying at least one part of the mesh model as at least one feature based on predetermined rules, classifying the at least one feature, and organizing the at least one feature when the at least one feature is determined to be appropriately suggested or identified.

In some embodiments, the features are determined to be appropriately suggested or identified based on user input.

In some embodiments, the manipulating of the at least one feature includes receiving user input corresponding to selection of one of the at least one feature, receiving user input corresponding to manipulative interaction with the selected feature, generating a modified boundary based on the manipulative interaction, and regenerating the plurality of elements based on the modified boundary.

In some embodiments, the manipulative interaction includes at least one of virtually pushing, pulling, reorienting, repositioning, resizing, performing Boolean operations, or filling the selected feature.

According to various embodiments, the method further includes displaying a first interface having the at least one feature and displaying a second interface having a copy of the at least one feature. The copy of the at least one feature is manipulated in the second interface. The first interface and the second interface are displayed simultaneously.

In various embodiments, the method further includes determining the at least one feature having a size corresponding to a preferred segmentation size.

In some embodiments, the determining of the at least one feature includes determining an outer surface for the at least some of the plurality of elements and identifying the outer surfaces of two or more of the at least some of the plurality of elements to be a same feature based on an angle between the outer surfaces.

In some embodiments, at least a portion of the outer surface is free from contacting surface of another element.

According to some embodiments, the method further includes determining, based on user input, whether the at least one feature is appropriately identified and determining at least one different feature when the at least one feature is determined to be inappropriately identified.

In some embodiments, the determining of the at least one different feature includes combining two or more previously identified features based on user input.

A system is described herein for enabling direct modeling for a mesh model, including, but not limited to, an interface and a processor configured to obtain a mesh model of a physical object, the mesh model including a plurality of elements, determine at least one feature associated with at least some of the plurality of elements of the mesh model, and manipulate the plurality of elements of the mesh model by manipulating the at least one feature.

In various embodiments, described is a non-transitory processor readable storage media storing a program that when executed in a processor of a device causes the processor to perform a method, the method including obtaining a mesh model of a physical object, the mesh model including a plurality of elements, determining at least one feature associated with at least some of the plurality of elements of the mesh model, and manipulating the plurality of elements of the mesh model by manipulating the at least one feature.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION OF THE PREFERRED EMBODIMENTS

Figure 1:
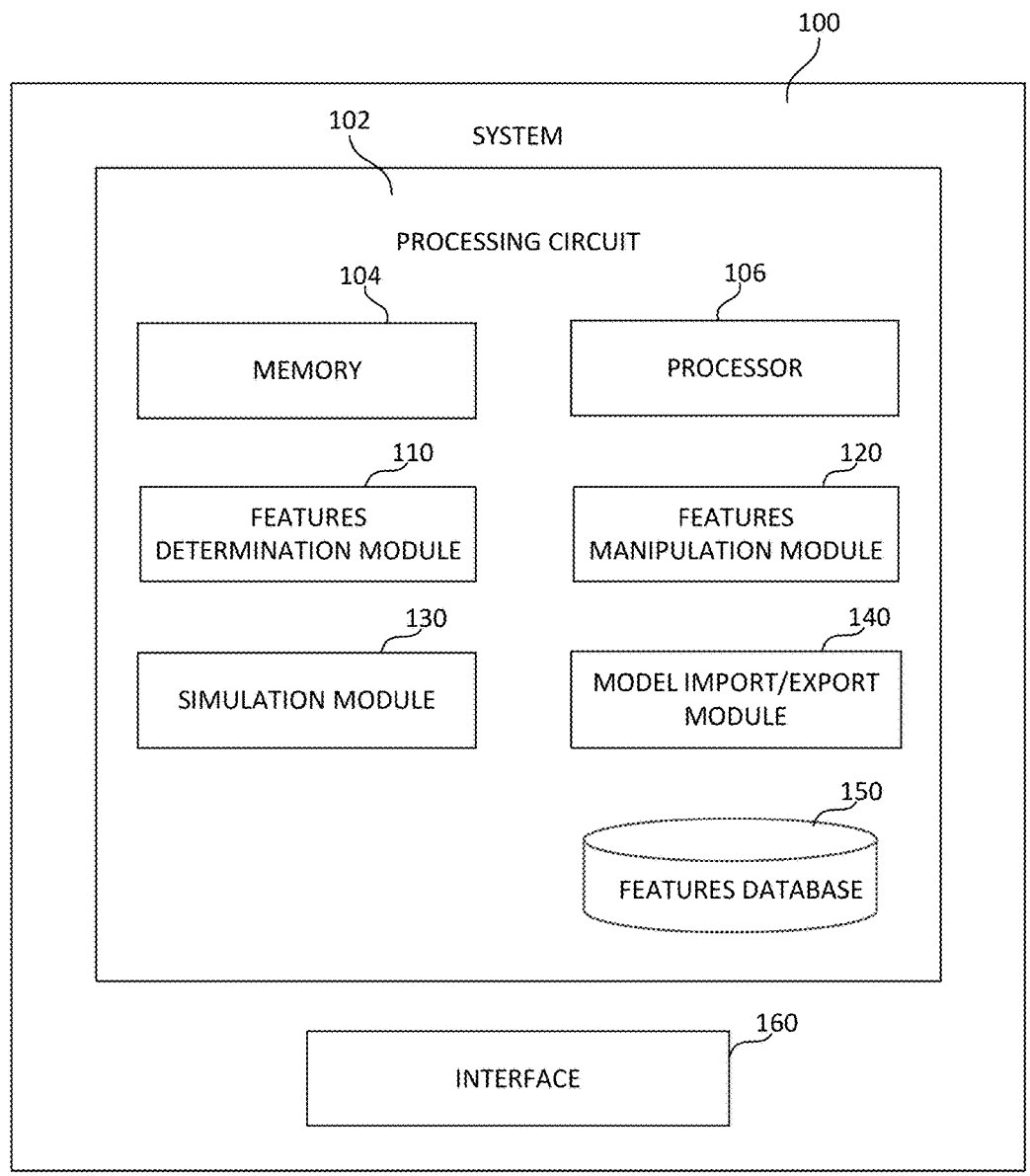
FIG. 1 is a block diagram illustrating an example of a feature manipulation module as implemented in a system according to various embodiments.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Referring generally to the figures, embodiments described herein extend direct modeling to FEA-based simulation platforms. In particular, the FEA-based direct modeling may enable a convenient simulation-driven 3-dimensional engineering tool for conceptual engineering, conceptual analysis, model preparation, and manufacturing engineering. For example, advantages associated with the FEA-based direct modeling may include, but not limited to, intuitive geometric manipulation (e.g., push/pull functionalities), automatic detection and fix of two or more geometric features that should contact one another, feature extraction, ability to create and edit large mesh assemblies, and the like.

In particular embodiments, the FEA-based direct modeling as described herein may be implemented with orphan mesh models, without any geometry attached therewith. An orphan mesh may be a collection of elements without designated geometry (i.e., the mesh may be "orphaned" from geometry). The FEA-based direct modeling may also be implemented without using any CAD non-uniform rational basis spline (NURBS). The orphan mesh may be imported or otherwise extracted from a database. In other embodiments, the FEA-based direct modeling may be implemented with mesh models with at least a portion or all of the model having geometry attached therewith.

With respect to FEA-based direct modeling, a feature may be associated with one or more elements forming a vertex, edge, surface, volume, a combination thereof, and/or the like. Manipulation of the features may include, but not limited to, push, pull, move, drag or otherwise reposition, resize, reorient, and/or reshape one or more features using a user interface. In some embodiments, operations involving manipulation of the features may include generating a hole, fillet, chamfer, pivoting, Boolean, cutout, patent creation, and/or the like. As used herein, Boolean operations may include union (total/combination of two or more separate features), subtract (remainder of a first feature having at least an overlapping portion with a second feature subtracted from the first feature), intersect (the overlapping portion between two or more separate features), and/or the like. In various embodiments, the manipulation of the features may enable free-form operations (e.g., manipulating an initial model having an initial shape (e.g., a ball) to a remodeled shape (e.g., a hair dryer). As described herein, all manipulation performed using the FEA-based direct modeling may be based on the mesh models without using geometry or CAD NURBS models.

A system may include a processing circuit supporting at least a feature determination module, feature manipulation module, simulation module, and model import/export module. In some embodiments, the model import/export module may be configured to import a mesh model from a database. The feature determination module may be configured to determine (e.g., classify or identify) features based on rules stored in a rule database. For example, parts (e.g., a vertex, edge, surface, volume, region, and/or the like) of the mesh model may be identified (e.g., based on surface angle rules) as features. The identified features may be classified and organized. The features identification and classification processes may be iterative in nature. For example, user input may be received to indicate whether the features have been appropriately determined (e.g., identified, classified, organized, a combination thereof, and/or the like).

The feature manipulation module may be configured to allow a user to manipulate each determined feature of the mesh model in the manner described herein, via the user interface. For example, elements associated with each feature may be moved or otherwise manipulated as a whole. Some additional elements may be added or subtracted from the elements associated with the originally identified feature. A simulation module may be configured to perform various types simulations based on the manipulated mesh model.

In some embodiments, the feature determination module may determine or otherwise extract two or more features and/or sub mesh models from a single mesh model. The two or more features may be organized as assemblies, parts, connections, a combination thereof, and/or the like. Each feature may be viewed separately (in a separated, exploded view) and manipulated (as supported by the feature manipulation module) via the user interface. In various embodiments, any part of a mesh model may be manipulated (e.g., modifies or having additional parts added on) by snapping (via the user interface as configured by the feature manipulation module) the mesh model into a sketcher. This allows the user to generate any models or shapes from any existing mesh models.

As used herein, "features" may refer to identifiable aspects of a mesh model. For example, features may include vertices, edges, surfaces, volumes, a combination thereof, and/or the like. While surface features may be used as non-limiting examples for illustrative purposes, one of ordinary skill in the art will appreciate that other types of features may be implemented in similar manners.

FIG. 1 is a block diagram illustrating an example of a feature manipulation module 120 as implemented in a system 100 according to various embodiments. Referring to FIG. 1, the feature manipulation module may be a module configured to virtually perform manipulation on defined features (e.g., vertex features, linear features, surface features, volume features, a combination thereof, and/or the like) through receiving user input corresponding to the manipulation. The system 100 may support FEM and FEA.

The system 100 may include a processing circuit 102 and an interface 160. The processing circuit 102 may be part of a workstation computer or other suitable types of computing device. The processing circuit 102 may include various modules for executing various functions described herein. The processing circuit 102 may include memory 104, processor 106, feature determination module 110, feature manipulation module 120, simulation module 130, model import/export module 140, and features database 150. The system 100 may include other devices such as a network system, wireless or wired communications systems, printers, and/or the like for performing various functions described herein.

The processor 106 may include any suitable data processing device, such as a general-purpose processor (e.g., a microprocessor), but in the alternative, the processor 106 may be any conventional processor, controller, microcontroller, or state machine. The processor 106 may also be implemented as a combination of computing devices, e.g., a combination of a digital signal processor (DSP) and a microprocessor, a plurality of microprocessors, at least one microprocessors in conjunction with a DSP core, or any other such configuration. For example, the processor 106 may be, but is not limited to being, an Intel® designed processor, AMD® designed processor, Apple® designed processor, QUALCOMM® designed processor, or ARM® designed process.

The memory 104 (or storage device) may be operatively coupled to the processor 106 and may include any suitable device for storing software instructions and data for controlling and use by the processor 106 to perform operations and functions described herein, including, but not limited to, random access memory (RAM), read only memory (ROM), floppy disks, hard disks, dongles or other recomp sensor board (RSB) connected memory devices, or the like. The memory 104 may include non-transitory storage media that is configured to store information regarding a geometric model that is being currently modified or was created in the past and/or computer readable instructions for the processes performed by the processor as described.

The memory 104 may send data to or receive data from the processor 106 and each of the modules/components in the system 100. In some embodiments, the memory 104 may be a remote storage device that stores data for the system 100 (or only the processing circuit 102) in a different node within a network from at least one module (e.g., the feature determination module 110, feature manipulation module 120, simulation module 130, model import/export module 140, features database 150, interface 160, a combination thereof, or the like) of the system 100. In other embodiments, the memory 104 may be located on the same computer system (e.g., within the same node of the network) as one or more of the modules of the system 100. In some embodiments, the memory 104 may include the features database 150. In other embodiments, the features database 150 may be implemented with a dedicated memory unit (other than the memory 104) such as, but not limited to, the memory 104.

The processor 106 may be coupled to one or more of all of the modules in the system 100 for performing the functionalities of each of the coupled modules. For example, the processor 106 may be coupled to the model import/export module 140 to import the mesh model of the physical object for features determination (with the feature determination module 110) and/or features manipulation (with the feature manipulation module 120). The mesh model may be orphan mesh models, without any geometry or NURBS attached therewith. Each feature may be associated with one or more elements of the mesh model. In some embodiments, the model import/export module 140 may import virtualized mesh model data or user-designed mesh model data (through the interface 160). Model data imported by the model import/export module 140 may be stored within the memory 104. The model import/export module 140 may send model information corresponding to the imported mesh model to one or more or all of the modules in the system 100. The model import/export module 140 may export the manipulated mesh model for model-based simulation.

The processor 106 may be coupled to the feature determination module 110 to identify features of the imported mesh model. For example, the feature determination module 110 may identify features of the mesh model based on properties of the elements in the mesh model and feature rules. The feature determination module 110 may also automatically suggest classification of the identified features based on classification rules stored in the features database 150. Furthermore, the feature determination module 110 may automatically organize identified and/or classified features based on organization rules stored in the features database 150. In a non-limiting example, the identified and/or classified features may be organized in a hierarchical tree. The feature determination module 110 may be coupled to the features database 150 for accessing the feature rules, classification rules, and/or organization rules stored therein.

The processor 106 and the interface 160 may be coupled to the feature manipulation module 120 to virtually manipulate identified and/or classified features of the imported mesh model. For example, user inputs received via the interface 160 may be relayed to the feature manipulation module 120. The feature manipulation module 120 may adjust or manipulate (e.g., reposition, resize, reorient, and/or reshape) one or more of identified and/or classified features based on the user input. The elements of the mesh model may react to the manipulation of the mesh model by the feature manipulation module 120 in the manner described.

In some embodiments, the features database 150 may be any non-transitory storage medium (e.g., the memory 104) configured to store various rules governing features identification and/or classification. Such rules may include feature rules, classification rules, and organization rules. The feature rules may relate to a manner in which elements of the mesh model may be grouped to form a feature.

The feature rules may be based on angles between outer surfaces of the elements. For example, when two elements have outer surfaces at an angle that is within a predetermined range (e.g., 1°, 2°, or 3° of 180°), the outer surfaces of these elements may be identified to be a same surface feature. The classification rules may relate to a manner in which the identified features may be classified. The classification rules may also be based on angles between outer surfaces of the elements. For example, when two elements have outer surfaces at an angle of 180°, the outer surfaces of these elements form a "flat surface." In another example, when each of multiple elements arranged in a same plane (each element connects to two elements in the plane) has an outer surface that connects to two other outer surfaces at an angle of 179.5°, then the multiple elements may form a "hole." The organization rules may include suitable rules for arranging the identified/classified features into hierarchical format.

In some embodiments, the interface 160 may include at least one input device for receiving input from the user and at least one display device for relaying information to the user. For example, the input device may include a computer with a monitor, keyboard, keypad, mouse, joystick, touch screen display, or other input devices performing a similar function. The keyboard may include alphanumeric and other keys, and may be connected to processing circuit 102 (e.g., the processor 106 and the memory 104) for communicating information and command selections. The input device may include a touch screen interface or movement sensing interface that may be combined with, or separated from, the display device of the interface 160. The input device may include a cursor control device, such as, but not limited to, a mouse, trackball, touch screen, motion sensor, cursor direction keys, and the like. Such input device may control cursor movement on the display device. The display device of the interface 160 may be any type of display (e.g., CRT display, LCD display, etc.) configured to provide audio and/or visual output to the user.

The processor 106 may be coupled to the simulation module 130 to perform FEA based simulations using the manipulated mesh model. The simulations may be performed using elements as manipulated by the user. In other words, the features identified and/or classified are not used directly in simulation. Rather, the features identified and/or classification may be used indirectly as a way to adjust the elements of the mesh model.

Figure 2A:
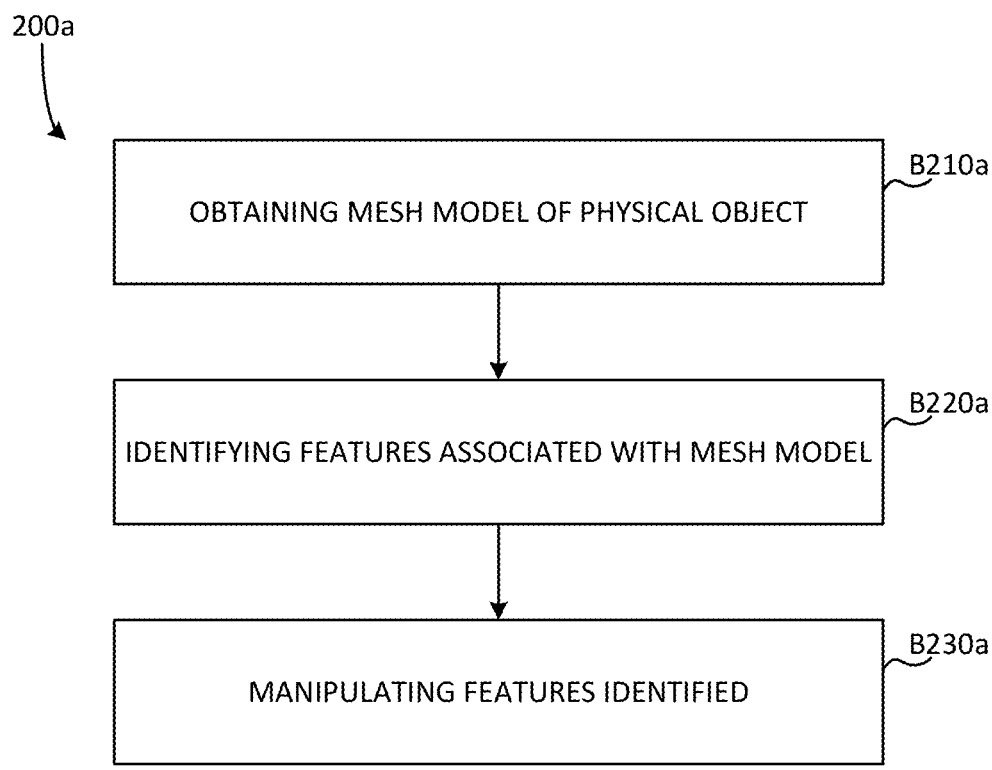
FIG. 2A is a process flow diagram illustrating an example of a method for providing features manipulation for a mesh model of a physical object according to various embodiments.

FIG. 2A is a process flow diagram illustrating an example of a method 200a for providing features manipulation for a mesh model of a physical object according to various embodiments. Referring to FIGS. 1-2A, a mesh model of the physical object may be obtained, at block B210a. The model import/export module 140 may input the mesh model from suitable sources. The mesh model may be a Nastran mesh (in a BDF file), stereo lithography mesh (in a STL file), or a scanned 3-dimensional mesh (in a scanned 3-dimensional mesh file). The mesh model (with its associated elements) may be displayed for view on the interface 160. The obtained mesh model is orphaned from any geometry and is without any NURBS attached therewith. At block B220*a*, the feature determination module 110 may be configured to identify features associated with the mesh model. In particular, the feature determination module 110 may associate two or more elements with an identified feature. The determined features and the elements (whether associated with the determined features or not) may be displayed simultaneously on the interface 160.

At block B230*a*, the feature manipulation module 120 may be configured to manipulate the features identified. The feature manipulation module 120 may manipulate the identified features based on user inputs received via the interface 160. The elements associated with the manipulated features may also be manipulated according to the manipulation of the features. The interface 160 may enable the user to manipulate the identified features by allowing the user to virtually (using, collectively, sketcher tools to) push, pull, reposition, resize, reorient, and/or reshape the identified features. Subsequently, simulation of the mesh model (having features manipulated by the user) may be performed by the simulation module 130 based on the elements (some of which have been manipulated corresponding feature manipulation).

Figure 2B:
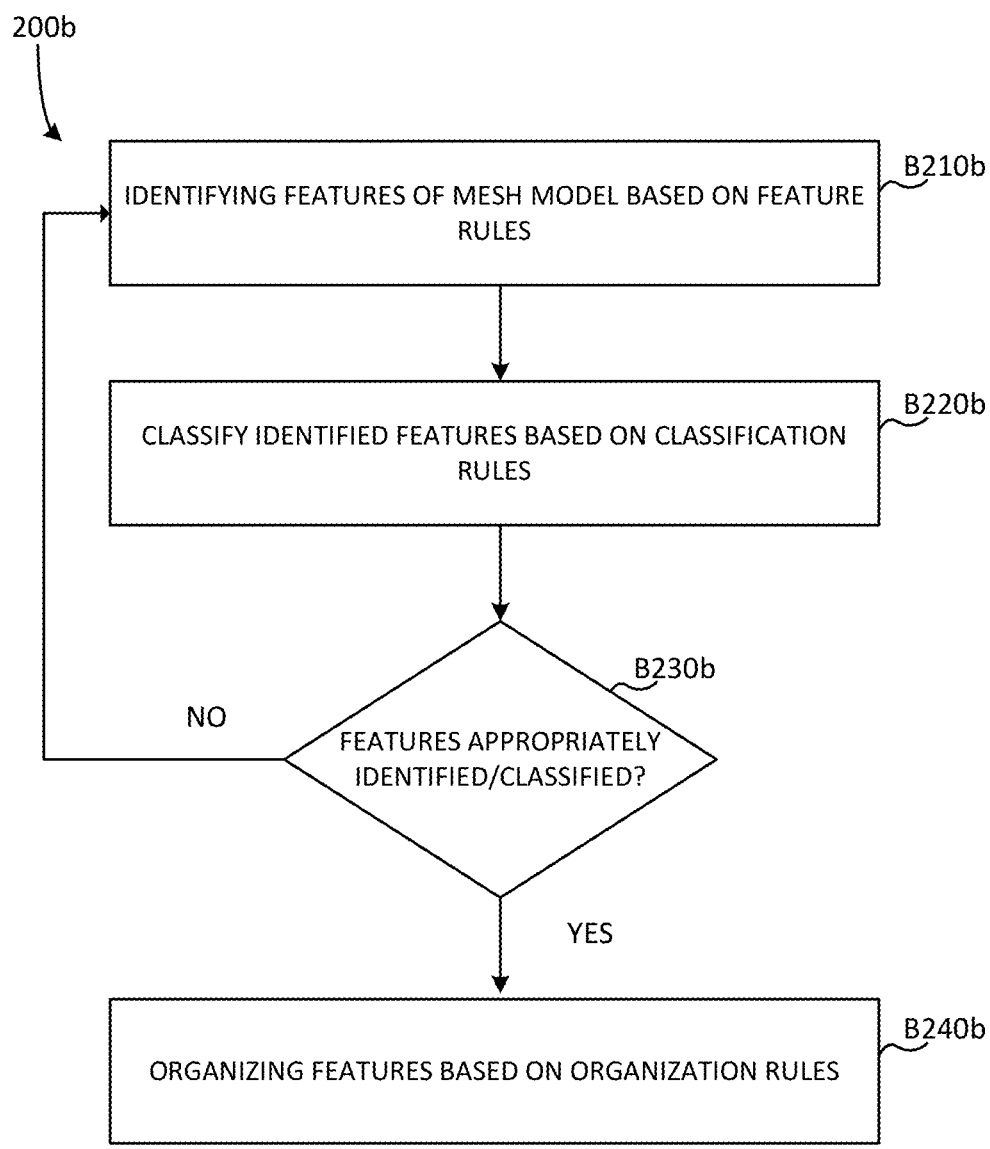
FIG. 2B is a process flow diagram illustrating an example of a method for defining features for a mesh model of a physical object according to various embodiments.

FIG. 2B is a process flow diagram illustrating an example of a method 200*b* for defining features for a mesh model of a physical object according to various embodiments. In particular embodiments, the method 200*b* may be a specific implementation of the identifying block (B220*a*) of the method 200*a*. Referring to FIGS. 1-2B, the feature determination module 110 may be configured to identify features of the mesh model based on the feature rules stored in the features database 150, at block B210*b*. The mesh model may include elements. Each element may be include various parts (e.g., surfaces of the element). The feature rules may dictate how parts of two or more elements may be identified as a feature.

At block B220*b*, the feature determination module 110 may be configured to classify the identified features based on classification rules stored in the features database 150. For example, an identified feature may be classified in the same group as a stored feature when the identified feature is sufficiently similar to the stored feature (as dictated by the classification rules). The stored feature may be originally stored in the features database 150 or, alternatively, is a previously identified feature now stored in the features database 150. Feature classifications may include lower-level classifications such as, but not limited to, round surface, rectangular surface, cylinder, prism, sphere, hole, and/or the like. Feature classifications may additionally or alternatively include higher-level classifications such as, but not limited to, a gear, joint, level, spring, bolt, button, hood, and/or the like.

At block B230*b*, whether the features are appropriately identified and/or classified may be determined. In some embodiments, the interface 160 may receive an user input as to whether the features are appropriately identified and/or classified. When the features are determined to be not appropriately identified or classified, the feature determination module 110 may be configured to re-identify the features of the mesh model based on the same or different (relaxed or tightened) feature rules, at block B210*b* (B230*b*: NO). The user may be allowed to alter the feature rules when it is determined that the features have not been properly identified or classified. For example, the density of the elements may be adjusted to provide finer element sizes for improved accuracy in identifying and classifying small features. In further embodiments, the user may manipulate the identified features (before re-running blocks B210*b* and B220*b*) in the manner described herein until the user has determined that the features have been properly identified/classified.

On the other hand, when the features are determined to be appropriately identified or classified (e.g., based on user input), the feature determination module 110 may organize the identified/classified features based on the organization rules, at block B240*b* (B230*b*:YES). In some embodiments, the features may be organized in a hierarchical fashion (e.g., in a hierarchical tree). Each feature in the hierarchical tree may be associated with (parts of) multiple elements.

Figure 3A:
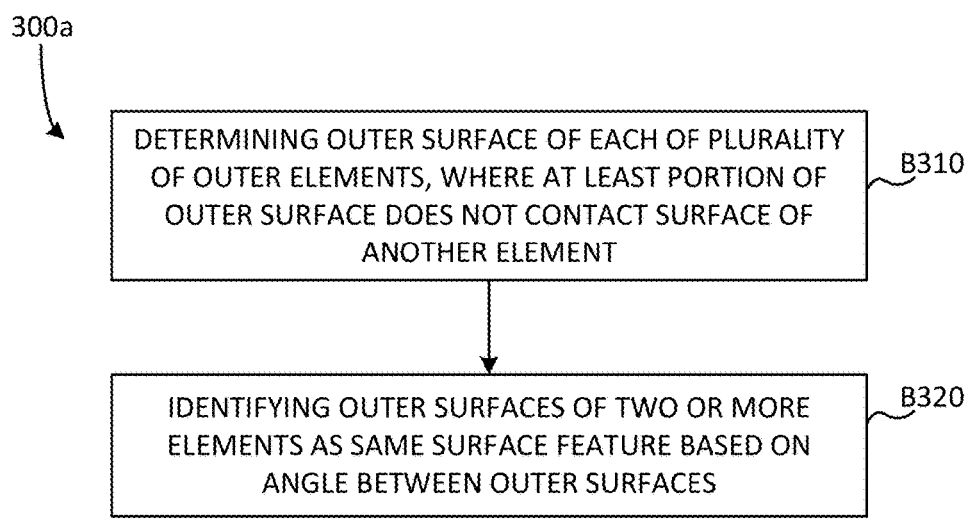
FIG. 3A is a process flow diagram illustrating an example of a method for defining surface features for a mesh model of a physical object according to various embodiments.
Figure 3B:
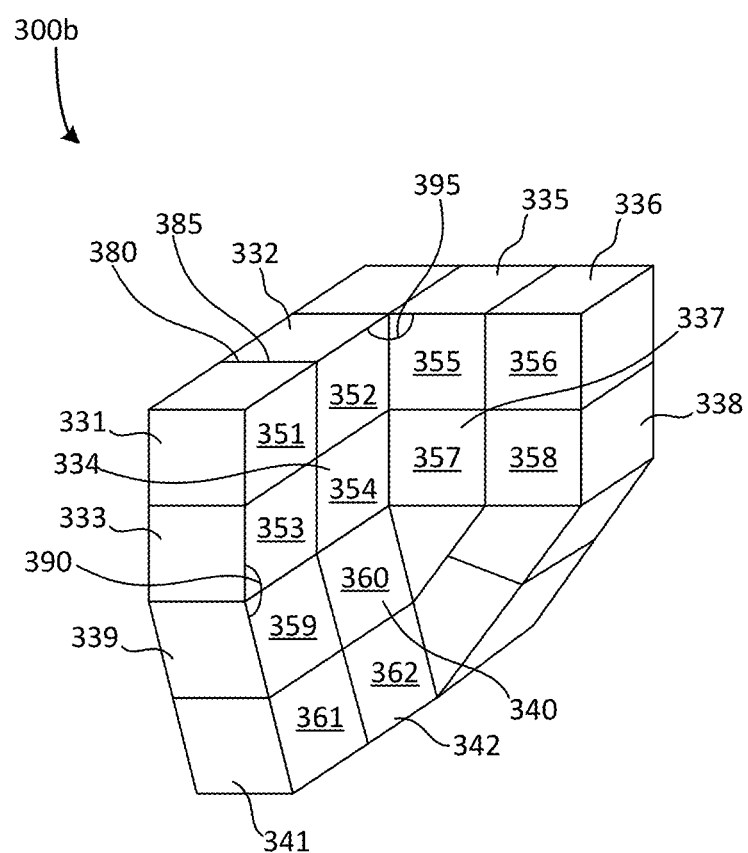
FIG. 3B is an example of a mesh model of a physical object according to various embodiments.

FIG. 3A is a process flow diagram illustrating an example of a method 300*a* for defining surface features for a mesh model of a physical object according to various embodiments. FIG. 3B is an example of a mesh model 300*b* of a physical object according to various embodiments. Referring to FIGS. 1-3B, the method 300*a* is illustrated with various aspects of the mesh model 300*b*. The mesh model 300*b* may include at least elements 331-342. While the elements 331-342 are shown to be hexahedral for clarity, one of ordinary skill in the art will appreciate that elements of other shapes (e.g., tetrahedron, pyramid, triangular prism, a combination thereof, and/or the like) may be implemented for the method 300*a* in a similar manner.

At block B310, the feature determination module 110 may automatically identify an outer surface for each of a plurality of outer elements. An outer element may be an element that has at least one surface (e.g., the outer surface) that does not contact a surface of another element. An element with no outer surface may not be an outer element. Each of the outer elements 331-342 may have at least outer surfaces 351-362, respectively. The outer surfaces 351-362 do not contact surfaces of other elements in the mesh model 300*b*. Surface 380 of the element 331 and surface 385 of the element 332 may be contacting one another, and therefore, are not outer surfaces.

Next at block B320, the feature determination module 110 may automatically identify outer surfaces of two or more elements as a same surface feature based on angle between the outer surfaces. In particular, feature rules concerning the angles between the outer surfaces may be stored in the features database 150.

Illustrating with a non-limiting example, the feature rules may state that two outer surfaces are a same feature surface when the two outer surfaces are at an angle within a 178°-182° range. Based on such rules, the outer surfaces 351-354 may be identified as a same surface feature given that the outer surfaces 351-354 are at 180° angles with respect to one another. Outer surfaces 355-358 may be identified as a same surface feature for the same reason. In addition, outer surfaces 359-362 may be identified as a same surface feature for the same reason. Given that the outer surfaces 353 (354) and 359 (360) are at 189° angles, the outer surfaces 353-354 and 359-360 may be identified as a same surface feature. On the other hand, the outer surfaces 352 and 355 may be at an 90° angle with respect to one another, and are therefore identified as separate surfaces. It follows that the surface feature associated with the outer surfaces 351-354 may be different from another surface feature associated with the outer surfaces 355-358.

Figure 4A:
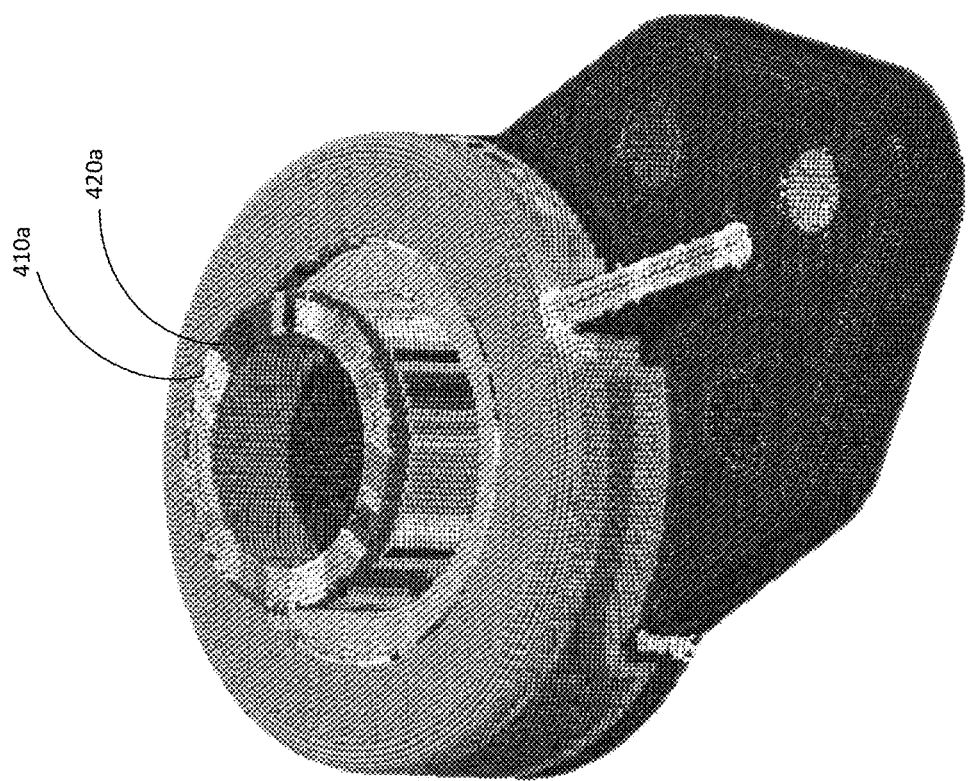
FIG. 4A is an example of a displayed screen showing a mesh model having identified features according to various embodiments.
Figure 4B:
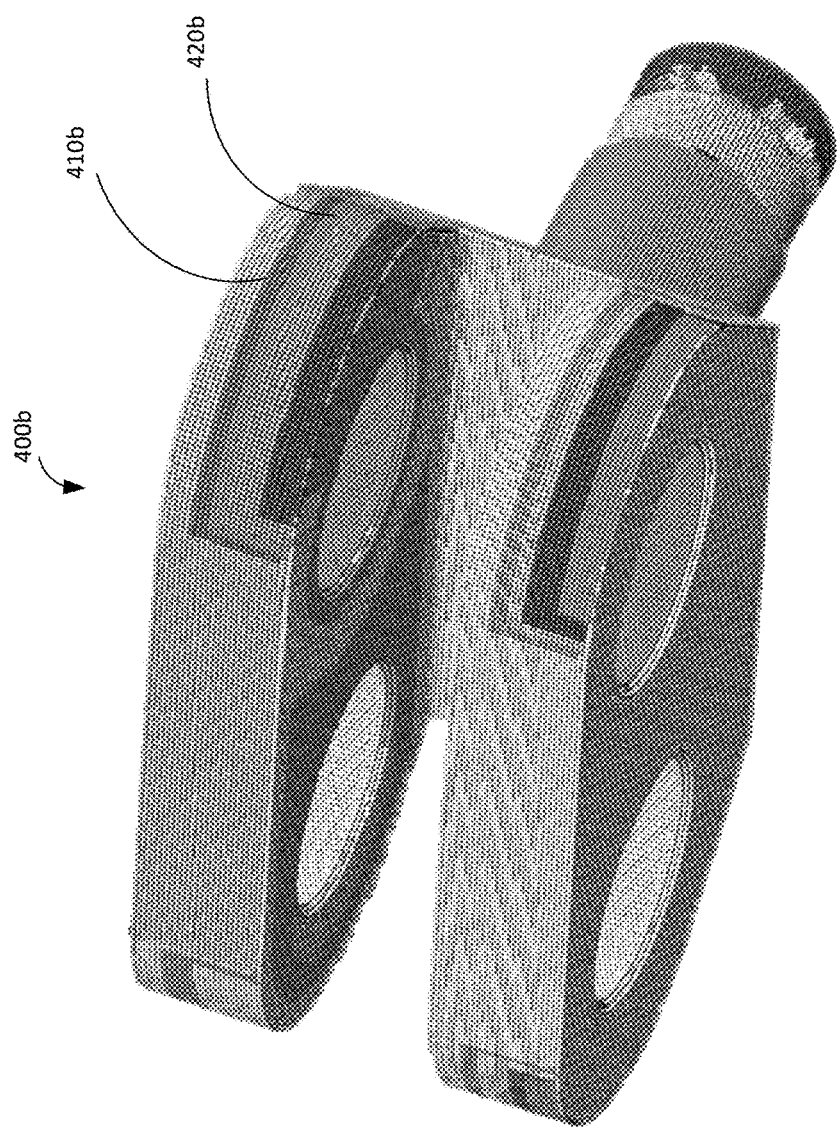
FIG. 4B is an example of a displayed screen showing a mesh model having identified features according to various embodiments.
Figure 4C:
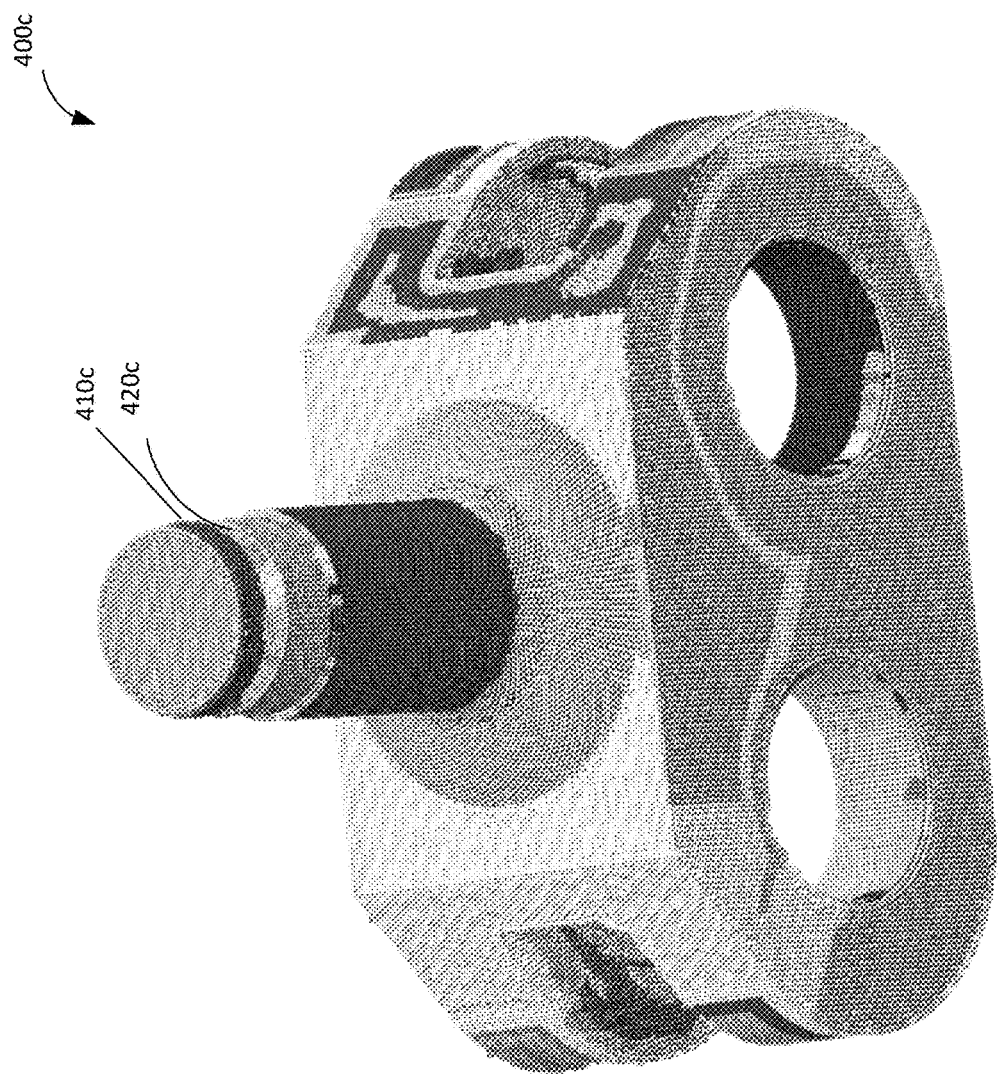
FIG. 4C is an example of a displayed screen showing a mesh model having identified features according to various embodiments.
Figure 5A:
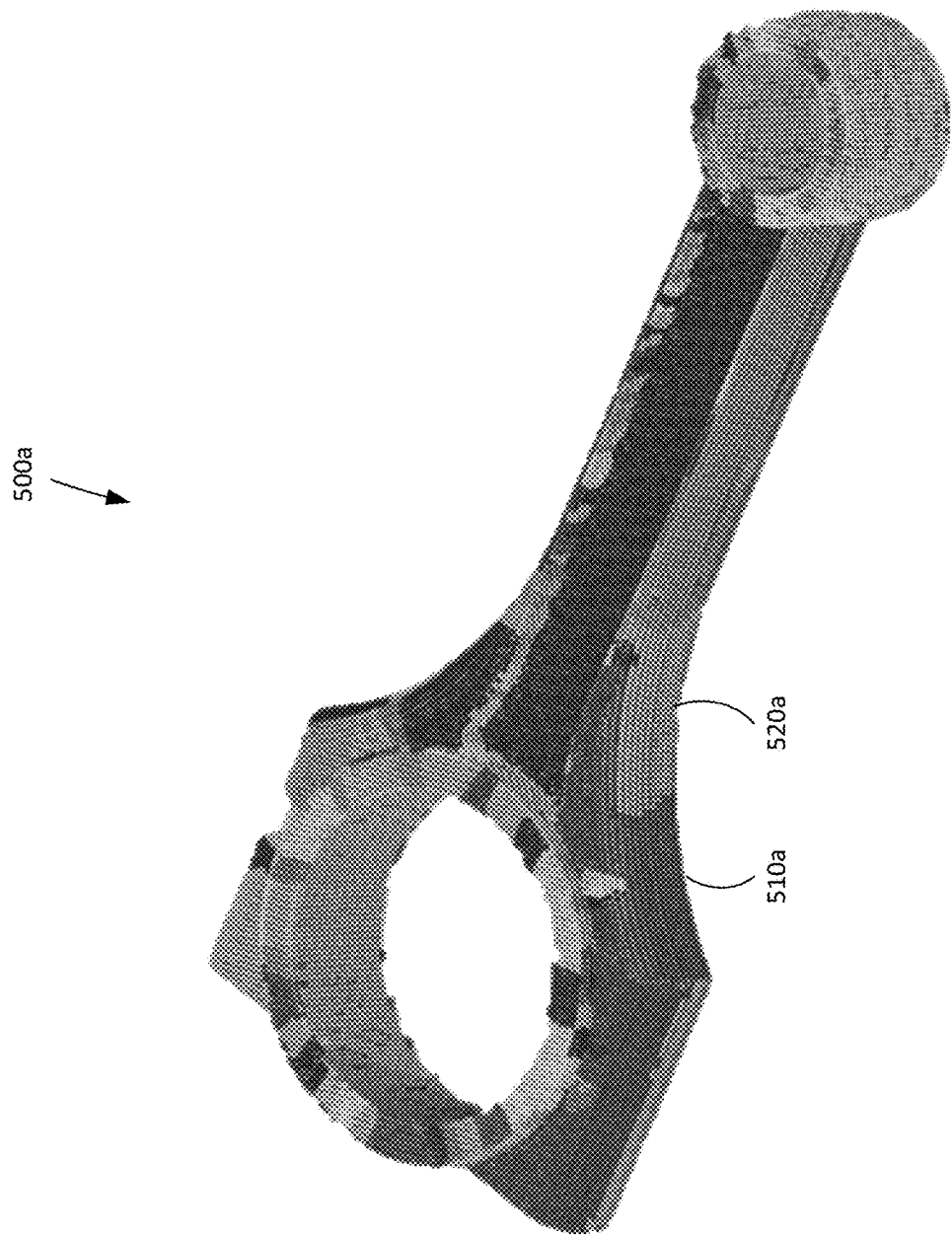
FIG. 5A is an example of a displayed screen showing a mesh model having identified features according to various embodiments.

FIG. 4A is an example of a displayed screen showing a mesh model 400*a* having identified features according to various embodiments. For example, the mesh model 400a may include at least the surface features 410a, 420a. FIG. 4B is an example of a displayed screen showing a mesh model 400b having identified features according to various embodiments. For example, the mesh model 400b may include at least the surface features 410b, 420b. FIG. 4C is an example of a displayed screen showing a mesh model 400c having identified features according to various embodiments. For example, the mesh model 400a may include at least the surface features 410c, 420c. FIG. 5A is an example of a displayed screen showing a mesh model 500a having identified features according to various embodiments. For example, the mesh model 500a may include at least the surface features 510a, 520a. Referring to FIGS. 1-5A, different features may be displayed in different graphical states such as, but not limited to, shading, colors, selectable region, highlighting, indicators (arrows, reference numerals, and the like), a combination thereof, and/or the like. The features may be identified at blocks B220a and B210b.

In some embodiments, the features may not be appropriately identified (e.g., B230b:NO). Illustrating with a non-limiting example, the surface features 410a, 420a (as well as other surface features on a top surface of an annular portion of the mesh model 400a) may be desired to be a same surface feature, instead of separate surface features as currently indicated by different shading. Illustrating with another non-limiting example, the surface features 410b, 420b (as well as other surface features on a rounded portion of the mesh model 400b) may be desired to be a same surface feature, instead of separate surface features as currently indicated by different shading. Illustrating with yet another non-limiting example, the surface features 410c, 420c (as well as other surface features on a cylindrical portion of the mesh model 400c) may be a same surface feature, instead of separate surface features as currently indicated by different shading. Illustrating with yet another non-limiting example, the surface features 510a, 520a (as well as other surface features on a chamfered portion of the mesh model 500a) may be a same surface feature, instead of separate surface features as currently indicated by different shading. The user may indicate inappropriate identification (B230b:NO) via the interface 160.

In some embodiments, after inappropriate identification has been determined, the identification block (B210b) may be reiterated using altered criteria. Illustrating with a non-limiting example, the feature rules (e.g., angle between surfaces) may be altered. The features rules may be manually reset by the user via the interface 160 or automatically reset by an incremental amount by the feature determination module 110. In particular, instead of identifying outers surfaces at angles within a first range)(179°-191° to be a same surface feature, the first range may be increased)(178°-192° or decreased)(179.5°-190.5° to include or exclude outer surfaces of elements that may belong or does not belong to a same surface feature.

In other embodiments, the user may manually guide adjustments to the inappropriately identified features via the interface 160. For example, the interface 160 may support selecting of two or more inappropriately identified features (e.g., the surface features 410a, 420a) and perform a Boolean operation as described. Specifically, the user may move a mouse cursor (provided by interface 160) over and/or click each of the inappropriately identified features for selection. The user may then indicate, via the interface 160, to perform a Boolean operation (e.g., union) on the selected inappropriately identified features. The user may also move the mouse cursor to select two different parts of a same identified feature. For example, the user may set or otherwise draw a break point, line, or surface between the two different parts. Based on the user input, the feature determination module 110 may separate the two parts into two different features, indicated by two different graphical states.

Figure 5B:
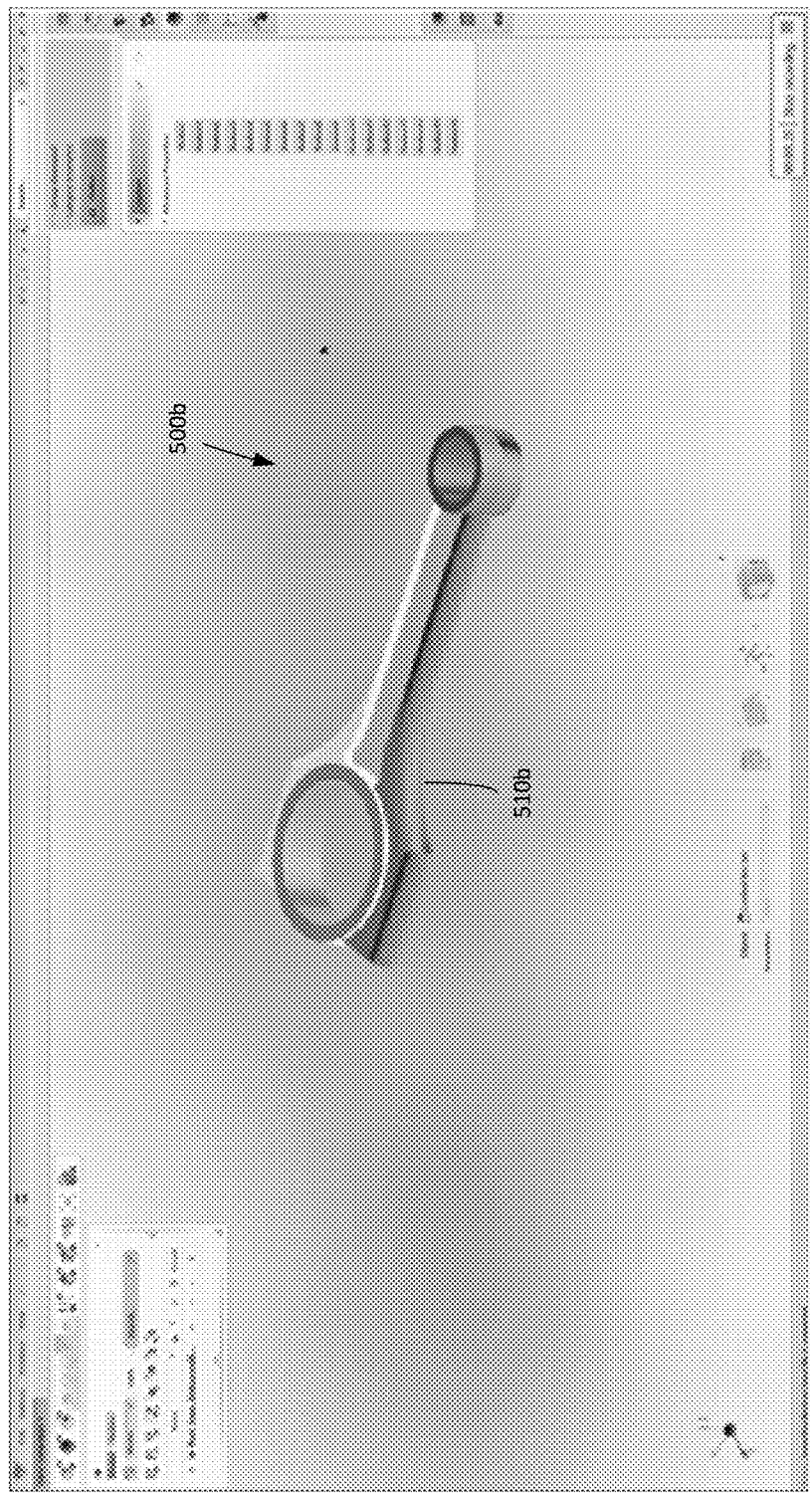
FIG. 5B is an example of a displayed screen showing a mesh model having identified features according to various embodiments.

FIG. 5B is an example of a displayed screen showing a mesh model 500b having identified features according to various embodiments. Referring to FIGS. 1-5B, all features of the mesh model 500b may be appropriately identified/classified (B230b:YES). In particular, the chamfered surface 510b may be a surface feature that may include the surface features 510a, 520a. In other words, the mesh model 500a may be a previous iteration of the mesh model 500b.

In some embodiments, the elements of the mesh may be displayed with their associated features simultaneously by the interface 160. For example, mesh elements and associated features may be displayed simultaneous for mesh models 400a, 400b, 400c, 500a. In particular embodiments, the mesh elements may be displayed as discrete partitions of the mesh models 400a, 400b, 400c, 500a while the features may be displayed as different graphical states of parts (e.g., outer surfaces) of two or more mesh elements. The user may select, via the interface 160, to view only the mesh elements of the mesh model, only the features of the mesh model, or both the mesh elements and the features associated with at least some of the mesh elements.

Figure 6A:
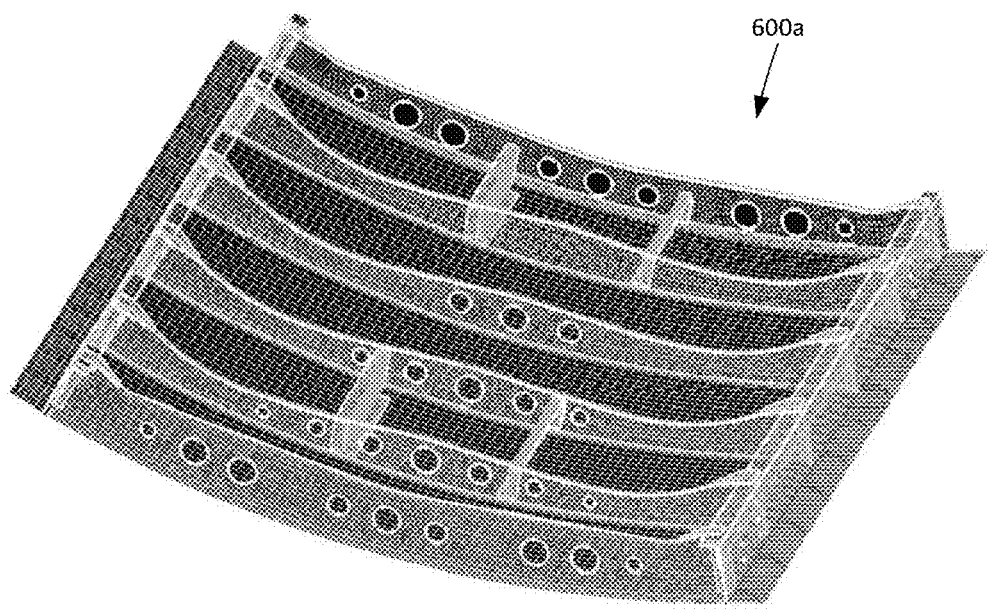
FIG. 6A is an example of a display screen showing a mesh model with the mesh elements displayed according to some embodiments.
Figure 6B:
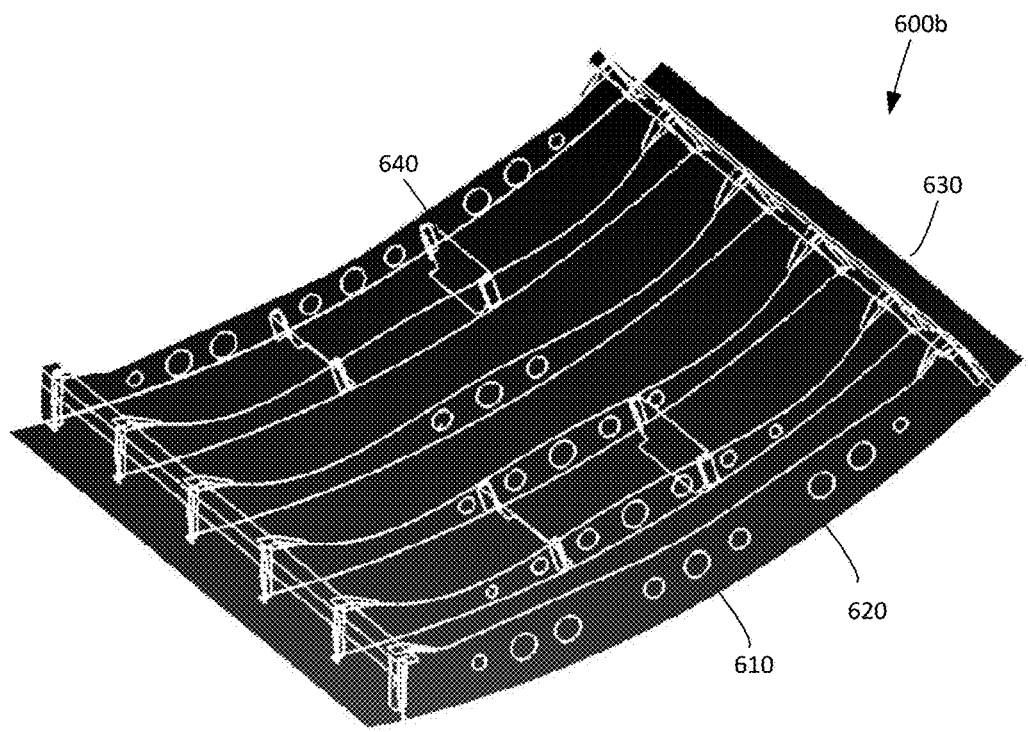
FIG. 6B is an example of a display screen showing a mesh model with the identified features displayed according to some embodiments.

For example, FIG. 6A is an example of a display screen showing a mesh model 600a with the mesh elements displayed according to some embodiments. FIG. 6B is an example of a display screen showing a mesh model 600b with the identified features displayed according to some embodiments. The mesh model 600a may correspond to the mesh model 600b. Specifically, the mesh model 600b may be a version of the mesh model 600a having all its features appropriately identified and organized.

The features of the mesh model 600b may include holes (e.g., a hole 610) and surfaces (e.g., surface features 620-640). In particular, the classification rules stored in the features database 150 may indicate that when multiple elements (or outer surfaces thereof) are arranged in a circle in a plane with no elements within the circle, the feature may be classified as a "hole" with respect to the plane by the feature determination module 110 (e.g., at block B220b). Holes may be negative features defined by boundaries based on vertices, edges, surfaces, or volumes with a lack of elements within the boundary. Holes may be manipulate by manipulating the boundary of the negative features and removing any extra elements within the boundary caused by the manipulation. On the other hand, positive features may be defined by boundaries based on vertices, edges, surfaces, or volumes positive features may have elements within the boundary.

Furthermore, the features may be organized (e.g., at block B240b) based on physical arrangement and relationships. For example, the holes (e.g., the hole 610) may be organized under the surface feature 620 (or the volume feature associated with the surface feature 620) given that the holes are on the surface 620. The surface features 620, 640 may be organized under the surface feature 630 (or the volume feature associated with the surface feature 630) given that the surface features 620, 640 are provided on the surface feature 630.

Figure 7A:
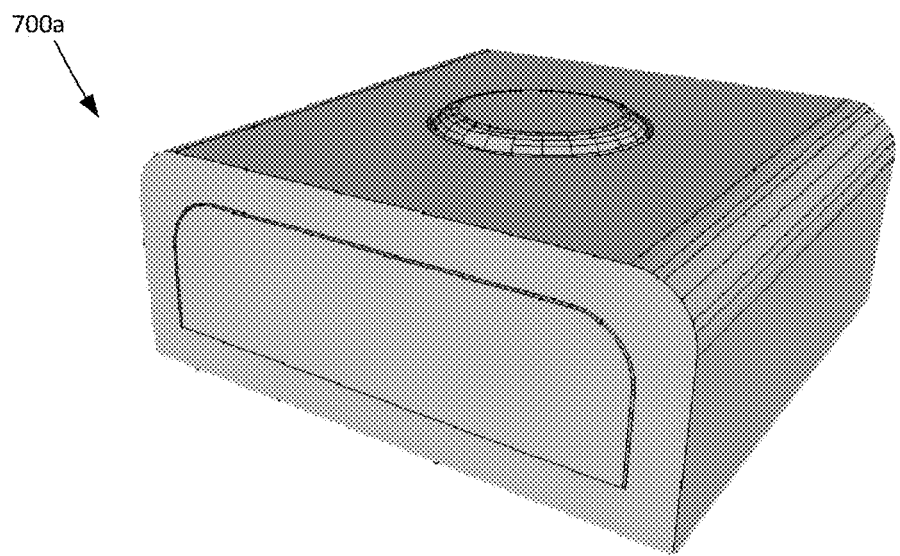
FIG. 7A is an example of a displayed screen showing a mesh model according to various embodiments.
Figure 7B:
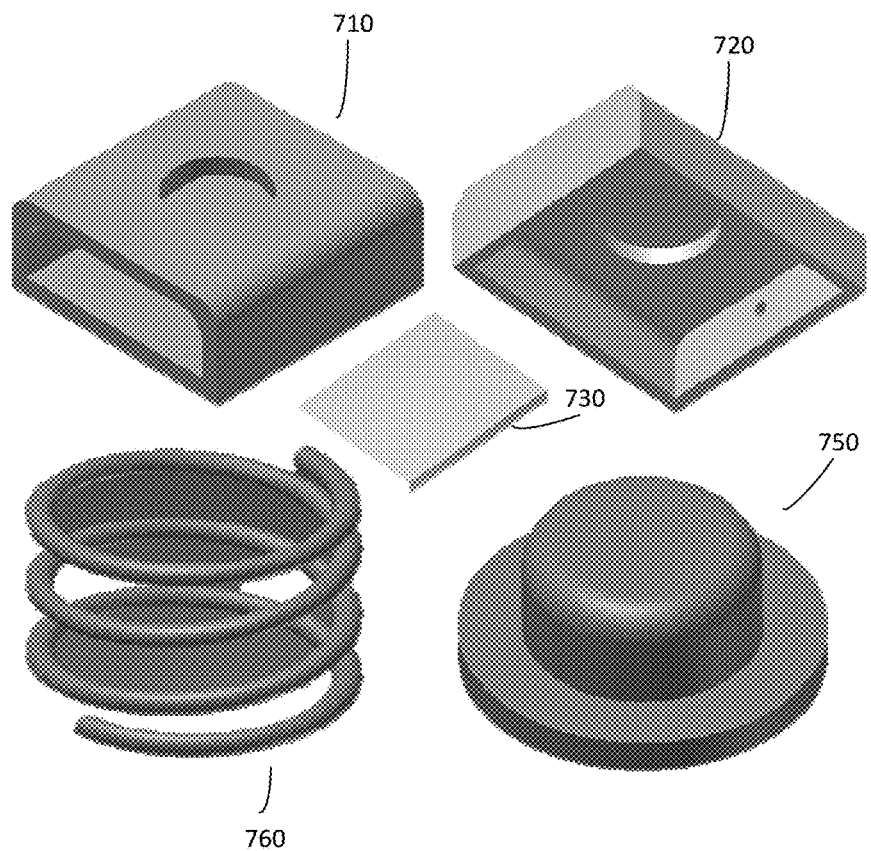
FIG. 7B is an example of a displayed screen showing various identified features of the mesh model of FIG. 7A according to various embodiments.

FIG. 7A is an example of a displayed screen showing a mesh model 700a according to various embodiments. The mesh model 700a may be a single orphan mesh model, without any geometry or NURBS attached therewith. FIG. 7B is an example of a displayed screen showing various identified features of the mesh model 700*a* according to various embodiments. The identified features may include volume features such as a body 710, top 720, plate 730, spring 740, and button 750. The identified features may be identified and/or classified (at blocks B210*b*-B230*b*:YES) from the single mesh model 700*a* and presented (e.g., displayed in an exploded or otherwise expanded view) separately as different features.

The identified features 710-750 may be stored in the features database 150 as separate features or submodels and retrieved later for the same project or a different project. Each of the identified features 710-750 may be associated with its own set of elements (which have been a portion of the single mesh model 700*a*). In other words, submodels may be "extracted" from the single mesh model 700*a* after appropriate identification, classification, and/or organization of the method 200*b*. The submodels may include elements and features associated with the elements. The submodels may remain as an orphan mesh model, without any geometry or NURBS attached therewith, when stored in or retrieved from the features database 150.

Figure 7C:
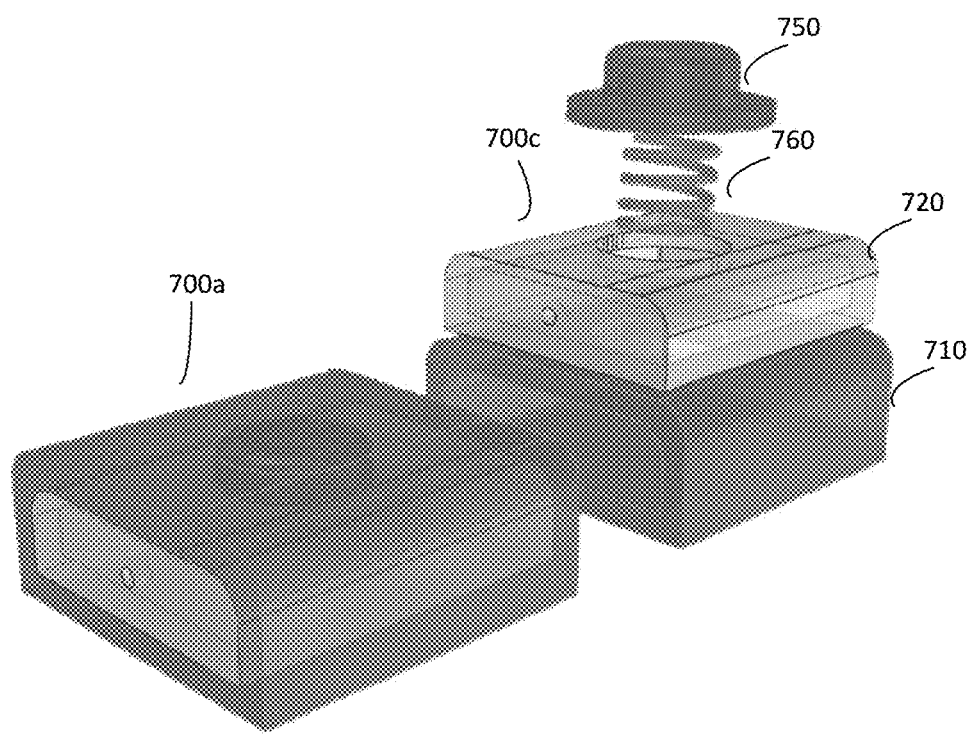
FIG. 7C is an example of a displayed screen showing the mesh model of FIG. 7A and a reassembled mesh model according to various embodiments.

FIG. 7C is an example of a displayed screen showing the mesh model 700*a* and a reassembled mesh model 700*c* according to various embodiments. The reassembled mesh model 700*c* may include reassembled submodels (the body 710, top 720, plate 730 (not shown in view), spring 740, and button 750) that have previously been features extracted from the mesh model 700*a*. The submodels may be organized as assemblies and/or parts. Each submodel may be treated as a regular mesh model (e.g., the mesh model 700*a*) and may further benefit (e.g., in an iterative fashion) from the disclosed embodiments. Accordingly, feature extraction tools as described can enable efficient managing of simulation and design of large mesh assemblies.

Figure 8B:
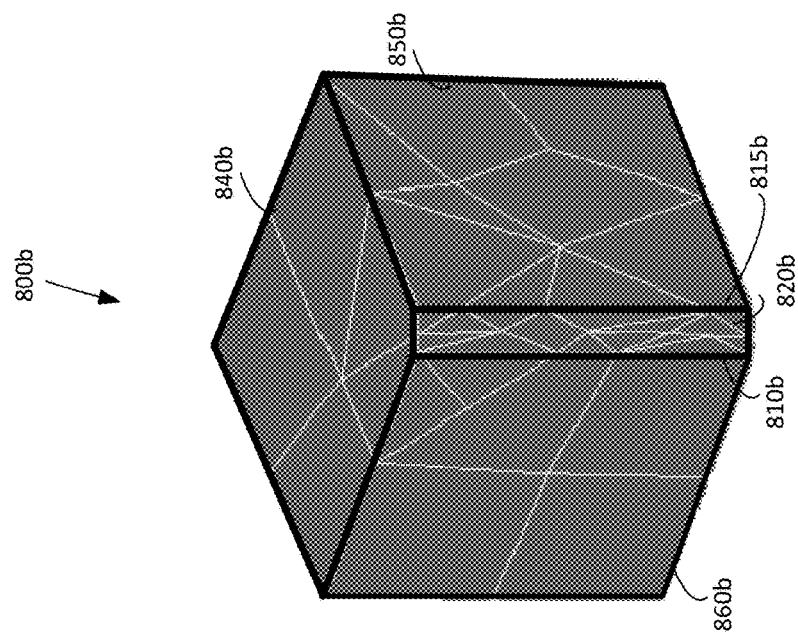
FIG. 8B is an example of a displayed screen showing a second mesh model according to various embodiments.
Figure 8A:
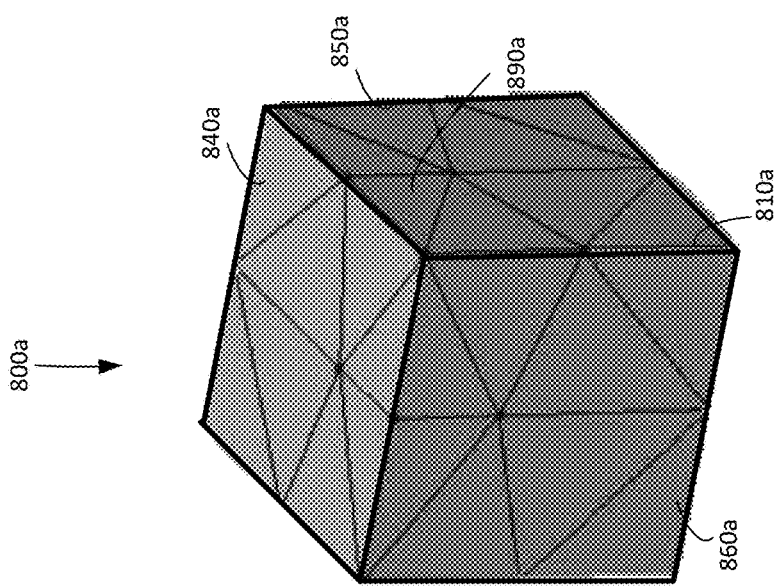
FIG. 8A is an example of a displayed screen showing a first mesh model according to various embodiments.

FIG. 8A is an example of a displayed screen showing a first mesh model 800*a* according to various embodiments. Referring to FIGS. 1-8A, the first mesh model 800*a* may include multiple elements. Various features associating with one or more parts of the elements may have been identified for the first mesh model 800*a* (at block B220*a* or with the method 200*b*). For example, at least surface features 840*a*-860*a* and edge feature 810*a* may be identified. One or more or all of vertex features, edge features, surface features, and volume features may be simultaneously identified and displayed by the interface 160. As shown in FIG. 8A, the first mesh model 800*a* may include at least the edge feature 810*a* and the surface features 840*a*-860*a*. In some embodiments, a same element (e.g., the element 890*a*) may be associated with two or more of a same type of features (e.g., surface features 840*a*, 850*a*). In further or alternative embodiments, a same element (e.g., the element 890*a*) may be associated with two or more different types of features (e.g., surface features 840*a*, 850*a* and edge feature 810*a*).

FIG. 8B is an example of a displayed screen showing a second mesh model 800*b* according to various embodiments. Referring to FIGS. 1-8B, the second mesh model 800*b* may be a regenerated mesh model in response to the edge feature 810*a* being pushed in (e.g., manipulated at block B230*a*) in the first mesh model 800*a*. The user may manipulate the first mesh model 800*a* by selecting the edge feature 810*a* and pushing the edge feature 810*a* toward the center of the first mesh model 800*a*, all with the interface 160. The depth and direction of the push may be based on user input. For example, the depth and direction in which the edge feature 810 are moved may be based on how the user moves the mouse cursor (direction, speed, holding time) after selecting the edge feature 810*a*. Based on such user input, a chamfered surface feature 820*b* may be formed.

Each of the features in the first mesh model 800*a* and the second mesh model 800*b* may represent a boundary for the elements. When at least one of the features (e.g., the edge feature 810*a*) is manipulated via the interface 160, new boundaries may form. For example, the new boundaries formed for the second model 800*b* may include modified surface features 840*b*-860*b* (each of which may be reduced in size as compared to their counterpart surface features 840*a*-860*a*, respectively), and new chamfered surface feature 820*b*. The chamfered surface feature 820*b* may be associated with at least two new edge features 810*b*, 815*b*. Based on the new boundary, elements may be regenerated, as shown for the second mesh model 800*b*. The shape, size, and/or number of the elements may be altered as a result.

Figure 8C:
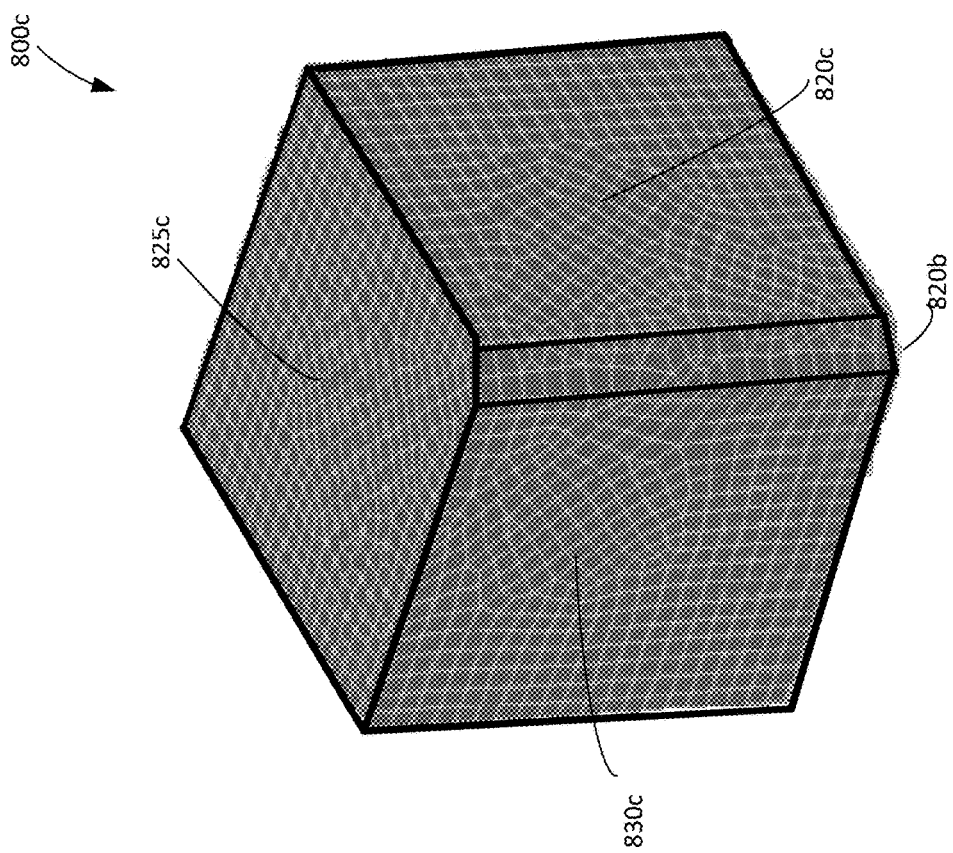
FIG. 8C is an example of a displayed screen showing a third mesh model according to various embodiments.

FIG. 8C is an example of a displayed screen showing a third mesh model 800*c* according to various embodiments. Referring to FIGS. 1-8C, the third mesh model 800*c* may be a regenerated mesh model in response to various locations on the modified surface features 840*b*-860*b* being pushed in (e.g., manipulated at the block B230*a*) in the second mesh model 800*b*. The user may manipulate the second mesh model 800*b* by selecting locations on each of the modified surface features 840*b*-860*b* and pushing those locations toward the center of the second mesh model 800*b*, all with the interface 160. The depth and direction of the push may be based on user input. For example, the depth and direction in which those locations are moved may be based on how the user moves the mouse cursor (direction, speed, holding time) after selecting each of those locations. Based on such user input, concaved surfaces 820*c*, 825*c*, 830*c* may be created.

Based on the concaved surfaces 820*c*, 825*c*, 830*c*, new boundaries may form for the third mesh model 800*c*. Based on the new boundaries, elements may be regenerated, as shown for the third mesh model 800*c*. The shape, size, and/or number of the elements may be altered as a result. In particular, a finer representation of the mesh model (e.g., with a larger number of smaller elements) may be adopted automatically given that the smaller changes in the boundaries (e.g., the concaved surfaces 820*c*, 825*c*, 830*c*) may be better represented by smaller elements. Alternatively, the user may set the sizes and number of elements via the interface 160.

Figure 8D:
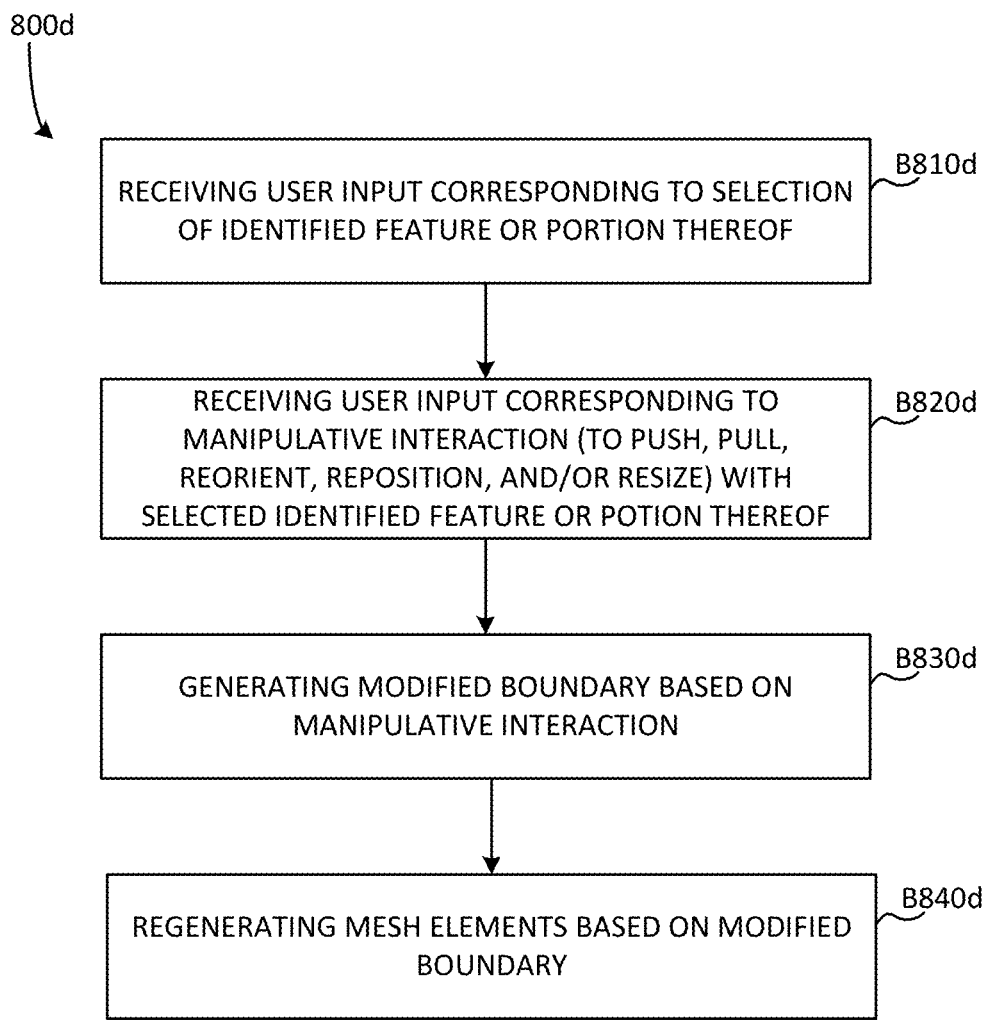
FIG. 8D is a process flow diagram illustrating an example of a method for features manipulation for a mesh model of a physical object according to various embodiments.

FIG. 8D is a process flow diagram illustrating an example of a method 800*d* for features manipulation for a mesh model of a physical object according to various embodiments. Referring to FIGS. 1-8D, the method 800*d* may correspond to block B230*a* of the method 200*a*. At block B810*d*, the feature manipulation module 120 may receive user input (from the interface 160) corresponding to a selection of an identified feature or a portion of the identified feature of the mesh model.

At block B820*d*, the feature manipulation module 120 may receive user input (from the interface 160) corresponding to manipulative interactions with the selected identified feature or the portion of the identified feature of the mesh model. Manipulative interactions may include one or more or all of pushing, pulling, reorienting, repositioning, resizing, performing Boolean operations, filling, and the like.

Pushing may result in subtracting a portion of the mesh model (and, in some cases, reshaping a remainder of the mesh model). Pulling may result in adding to the mesh model (and, in some cases, reshaping a remainder of the mesh model as a result). Reorienting may result in rotating the mesh model with respect to a user-defined axis while maintaining the shape of the mesh model. Repositioning may result in moving elements of the mesh model to a new position as a whole while maintaining the shape of the mesh model. Resizing may result in enlarging or shrinking the mesh model proportionally. Performing Boolean operations may result in union, subtract, and intersect operations as described with respect to two or more identified features or portions. Filling may result in reshaping the mesh model by generating mesh elements to occupy a space (e.g., any negative features) of the mesh model.

At block B830d, the feature manipulation module 120 may generate a modified boundary based on the manipulative interaction. At block B840d, the feature manipulation module 120 may regenerate the mesh elements based on the modified boundary.

Figure 9B:
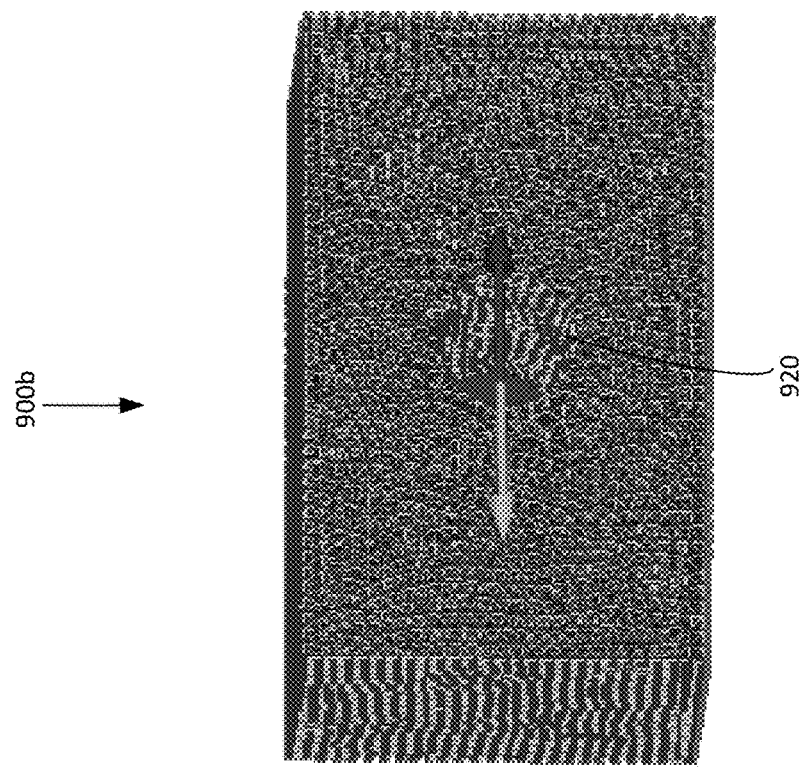
FIG. 9B is an example of a displayed screen showing a mesh model according to various embodiments.
Figure 9A:
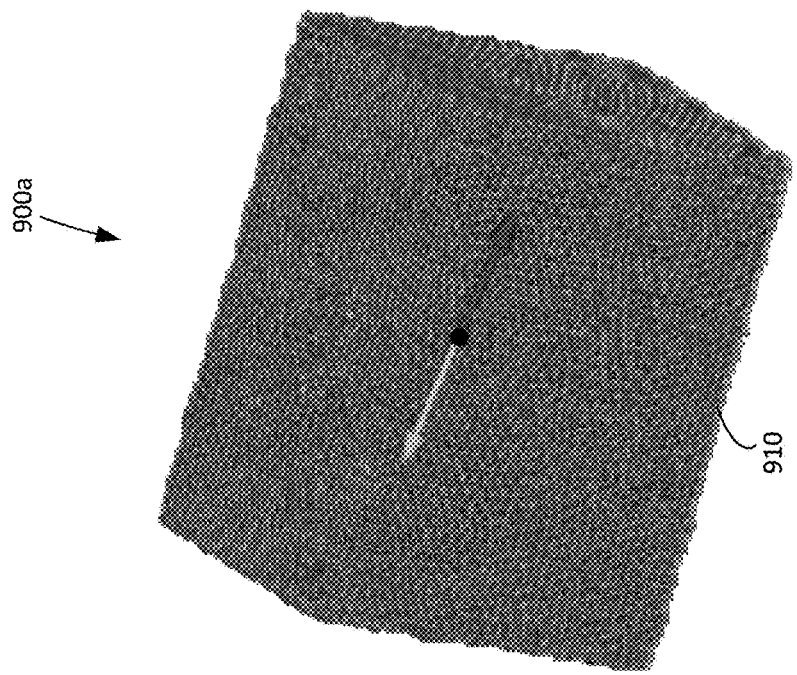
FIG. 9A is an example of a displayed screen showing a mesh model according to various embodiments.

FIG. 9A is an example of a displayed screen showing a mesh model 900a according to various embodiments. FIG. 9B is an example of a displayed screen showing a mesh model 900b according to various embodiments. The mesh model 900a may be manipulated (at the block B230a and/or with the method 800d) to become (regenerated as) the mesh model 900b. The mesh model 900a may include an identified volume feature associated with the entire mesh model 900a, as shown. A point 910 in the volume feature may be selected (at the block B810d). The user may indicate via the interface 160 that a hole is to be created at the point 910 (at the block B820d). In some embodiments, elements or features around the point 910 may be pushed away by the user via the user interface 160. In other embodiments, the user may specify that a hole is to be generated at the point 910. The feature manipulation module 120 may retrieve the stored hole feature from the features database 150 and implement the hole feature at the point 910. The user may reorient, reposition, and/or resize the hole feature using the interface 160. Once the orientation, position, and size of the hole has been appropriately determined by the user, the feature manipulation module 120 may generate the modified boundaries (at the block B830d) and regenerate the mesh 900b to include the hole 920 (at the block B840d).

Figure 10:
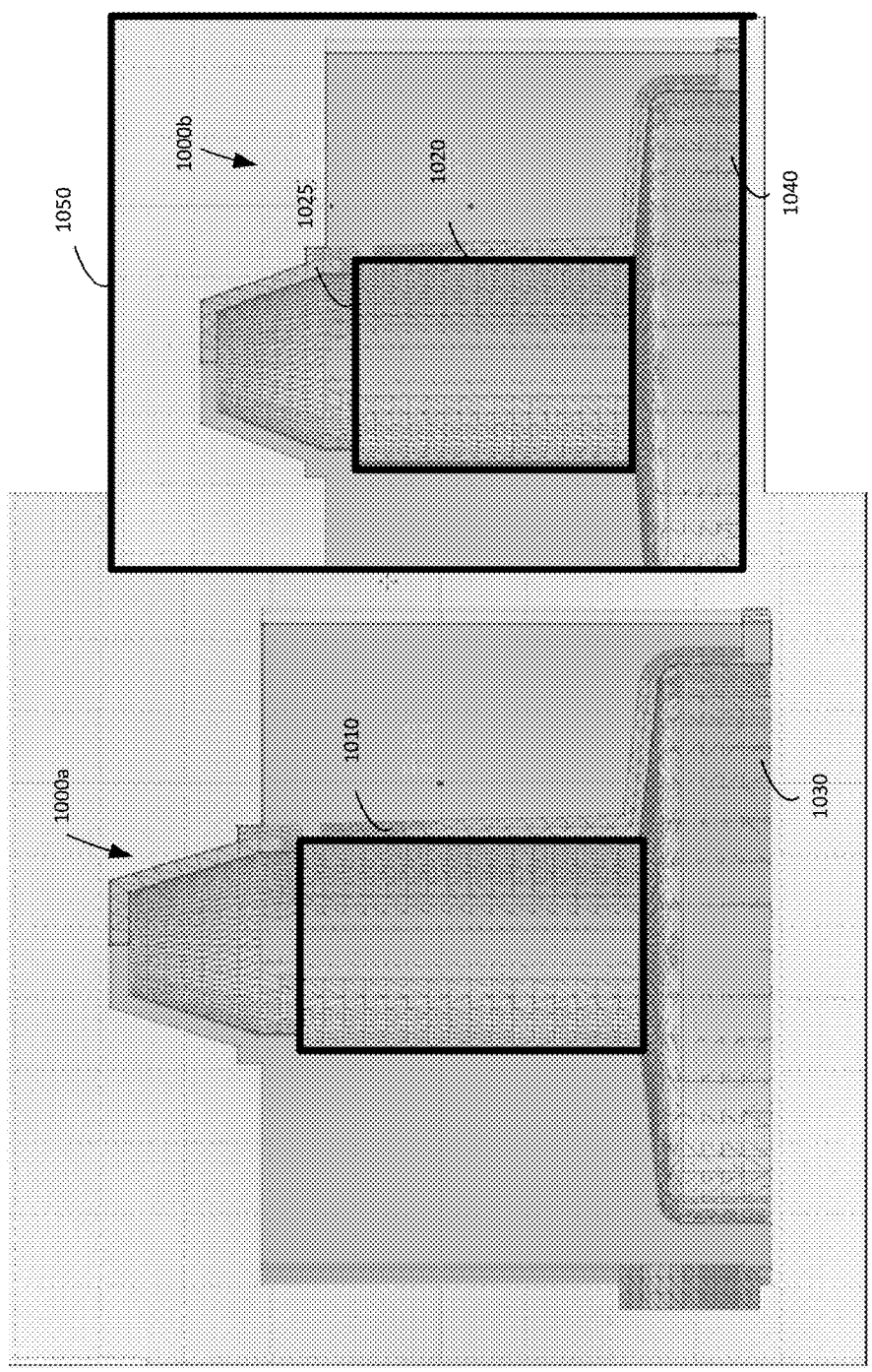
FIG. 10 is an example of a displayed screen showing a first mesh model and a second mesh model according to various embodiments.

FIG. 10 is an example of a displayed screen showing a first mesh model 1000a and a second mesh model 1000b according to various embodiments. Referring to FIGS. 1-10, the first mesh model 1000a may include identified features (at the block B220a and/or with the method 200b) such as, but not limited to, a cylindrical body 1010 and a base portion 1030. The second mesh model 1000b may include a modified cylindrical body 1020 (which corresponds to the cylindrical body 1010) and a corresponding base portion 1040 (which corresponds to the base portion 1030). Each of the cylindrical body 1010, base portion 1030, modified cylindrical body 1020, and corresponding base portion 1020 may be a volume feature, a surface feature, or a combination thereof. The user may select the cylindrical body 1010 for manipulation (at the block B230a and/or with the method 800d). The second mesh model 1000b may be displayed (after user selection of the cylindrical body 1010). The second mesh model 1000b may be at least a portion of the first mesh model 1000a.

The second mesh model 1000b may be displayed in a sketcher interface 1050. In some embodiments, the sketcher interface 1050 (and the second mesh model 1000b) may be displayed next to the first mesh model 1000a (simultaneous with the interface 160). As such, the user may compare the original pre-manipulation model (e.g., the first mesh model 1000a, which may remain unchanged while the second mesh model 1000b may be manipulated by the user, until the user indicates that the second mesh model 1000b is to replace the first mesh model 1000a) with the model that is being, has been, or will be manipulated. In other embodiments, the sketcher interface 1050 may be displayed instead of the first mesh model 1000a. The sketcher interface 1050 may enable direct modeling (e.g., manipulation at the block B230a and/or with the method 800d) with respect to a portion or all of the first mesh model. For example, the sketcher interface 1050 may provide user selectable tools for virtually pushing, pulling, reorienting, repositioning, resizing, performing Boolean operations, and/or filling at least a portion of the second mesh model 1000b. The second mesh model 1000b may initially appear, before any manipulation, to be identical to the first mesh model 1000a.

The user may push an upper surface/edge 1025 toward the corresponding base portion 1040 for shortening the longitudinal dimension of the second mesh model 1000b. The user may also enter desired dimensions of the modified cylindrical portion 1020. The sketcher interface 1050 may also provide other suitable tools for accepting user input related to desired manipulation parameters of the modified cylindrical portion 1020. The user may further indicate that the modified cylindrical body 1020 is appropriate via the interface 160. In response, the feature manipulation module 120 may replace the cylindrical body 1010 with the modified cylindrical body 1020 for the first mesh model 1000b, to be displayed by the interface 160.

Figure 11A:
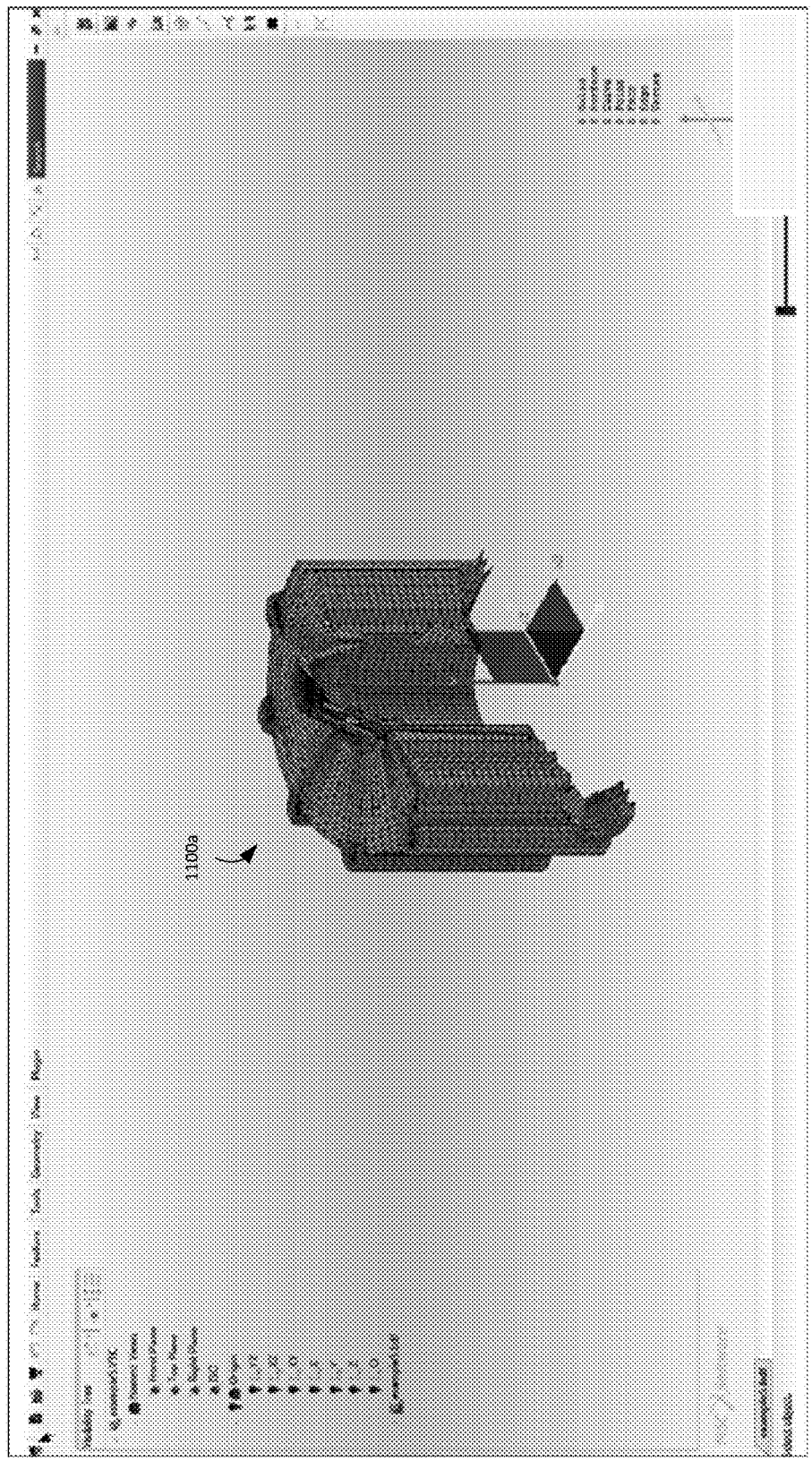
FIG. 11A is an example of a displayed screen showing a mesh model according to various embodiments.
Figure 11B:
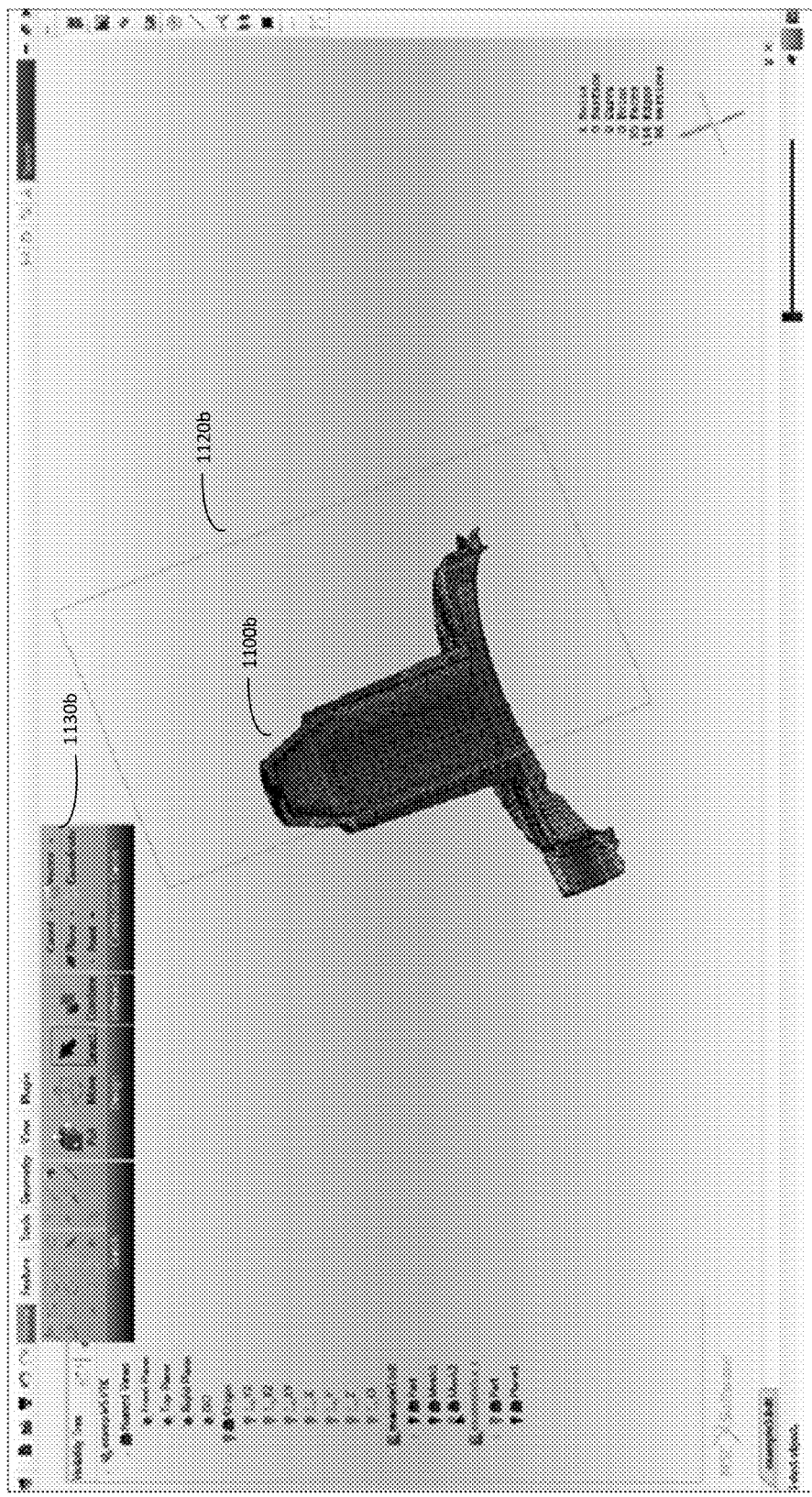
FIG. 11B is an example of a displayed screen showing a selected portion according to various embodiments.

FIG. 11A is an example of a displayed screen showing a mesh model 1100a according to various embodiments. Referring to FIGS. 1-11A, the mesh model 1100a may be obtained at the block B210a. The features may be identified at the block B220a and/or with the method 200b. FIG. 11B is an example of a displayed screen showing a selected portion 1100b according to various embodiments. Referring to FIGS. 1-11B, the selected portion 1100b may be a portion of the mesh model 1100a according to some embodiments. The selected portion 1100b may include one or more identified features of the mesh model 1100a. The user may select, with a selection box 1120b, the selected portion 1100b from the mesh model 1100a. The selection box 1120b may correspond to user input received via the interface 160 (e.g., a mouse cursor click-and-drag selection). The selection tool may be provided by a sketcher tools panel 1130b. The sketcher tools panel 1130b may provide selectable icons for operations such as, but not limited to virtually pushing, pulling, reorienting, repositioning, resizing, performing Boolean operations, filling, or selecting at least a portion of the mesh model 1100a and/or the selected portion 1100b.

Figure 11C:
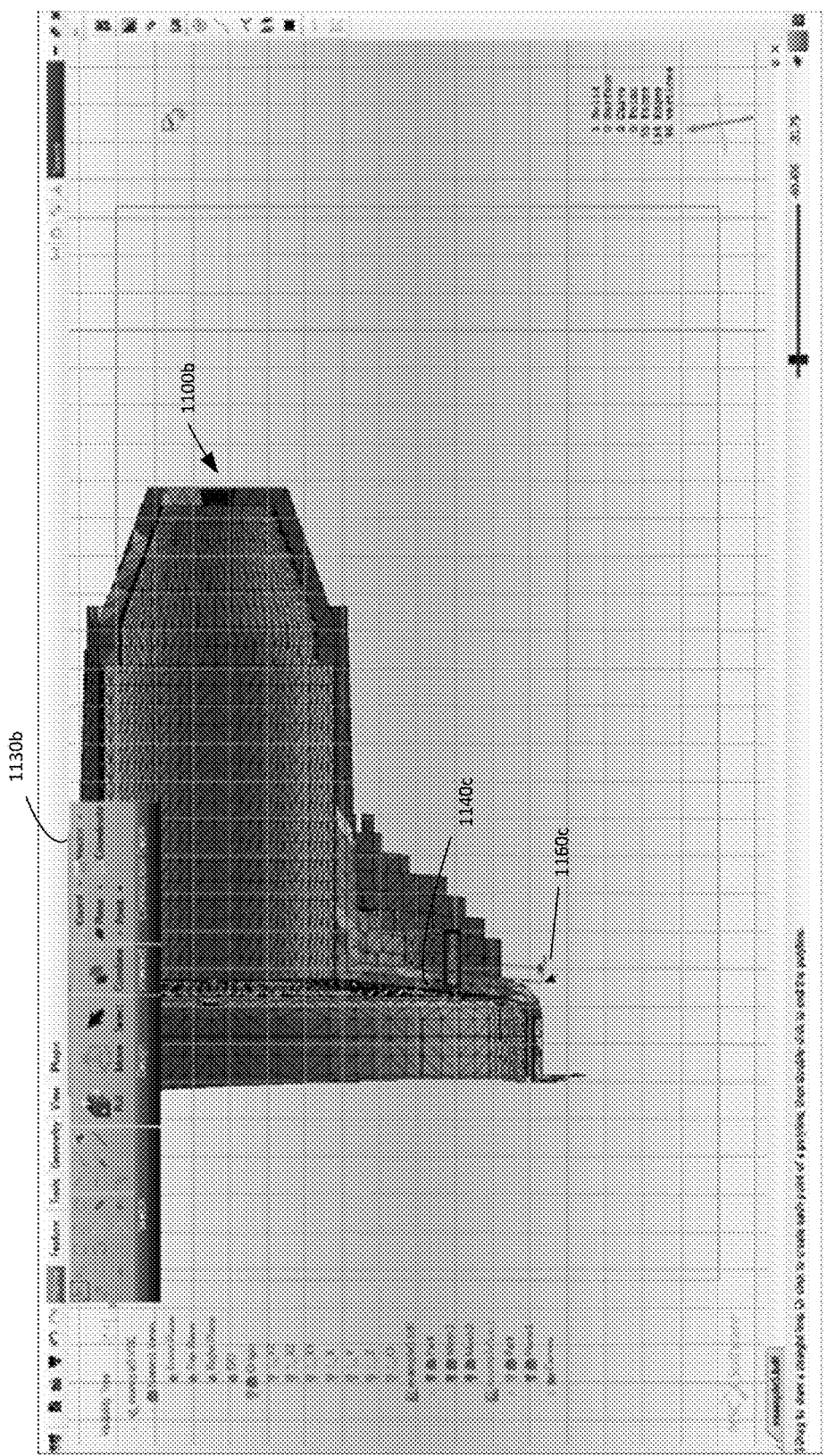
FIG. 11C is an example of a displayed screen showing the selected portion according to various embodiments.

FIG. 11C is an example of a displayed screen showing the selected portion 1100b according to various embodiments. Referring to FIGS. 1-11C, the selected portion 1100b may be manipulated (at the block B230a and/or with the method 800d) using the tools provided by the sketcher tools panel 1130b. For example, a base surface feature 1140c of the selected portion 1100b may have its dimensions manipulated with push/pull operations based on the movement of the mouse cursor 1160c.

Figure 12A:
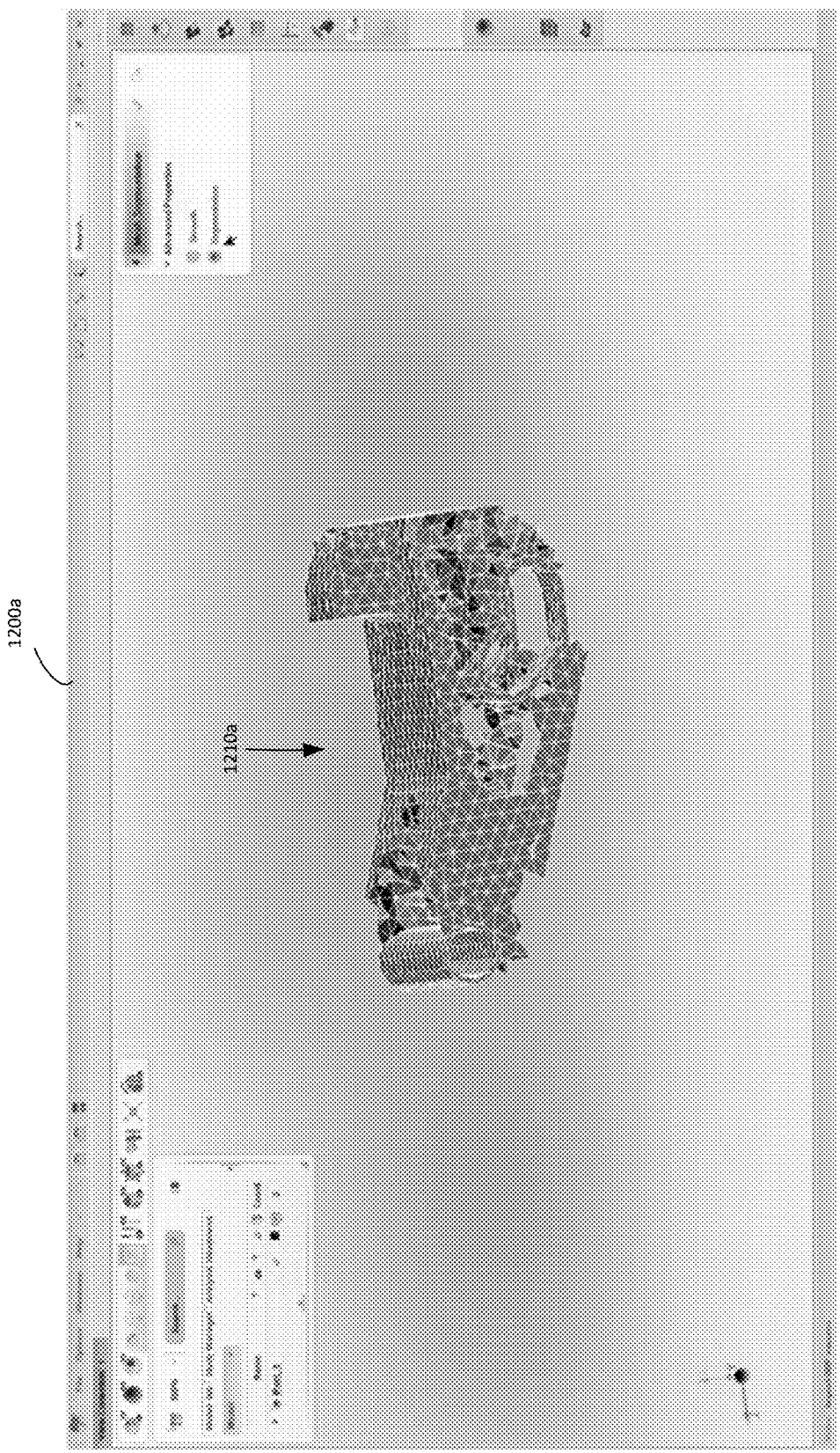
FIG. 12A is an example of a display screen interface showing a mesh model according to various embodiments.
Figure 12B:
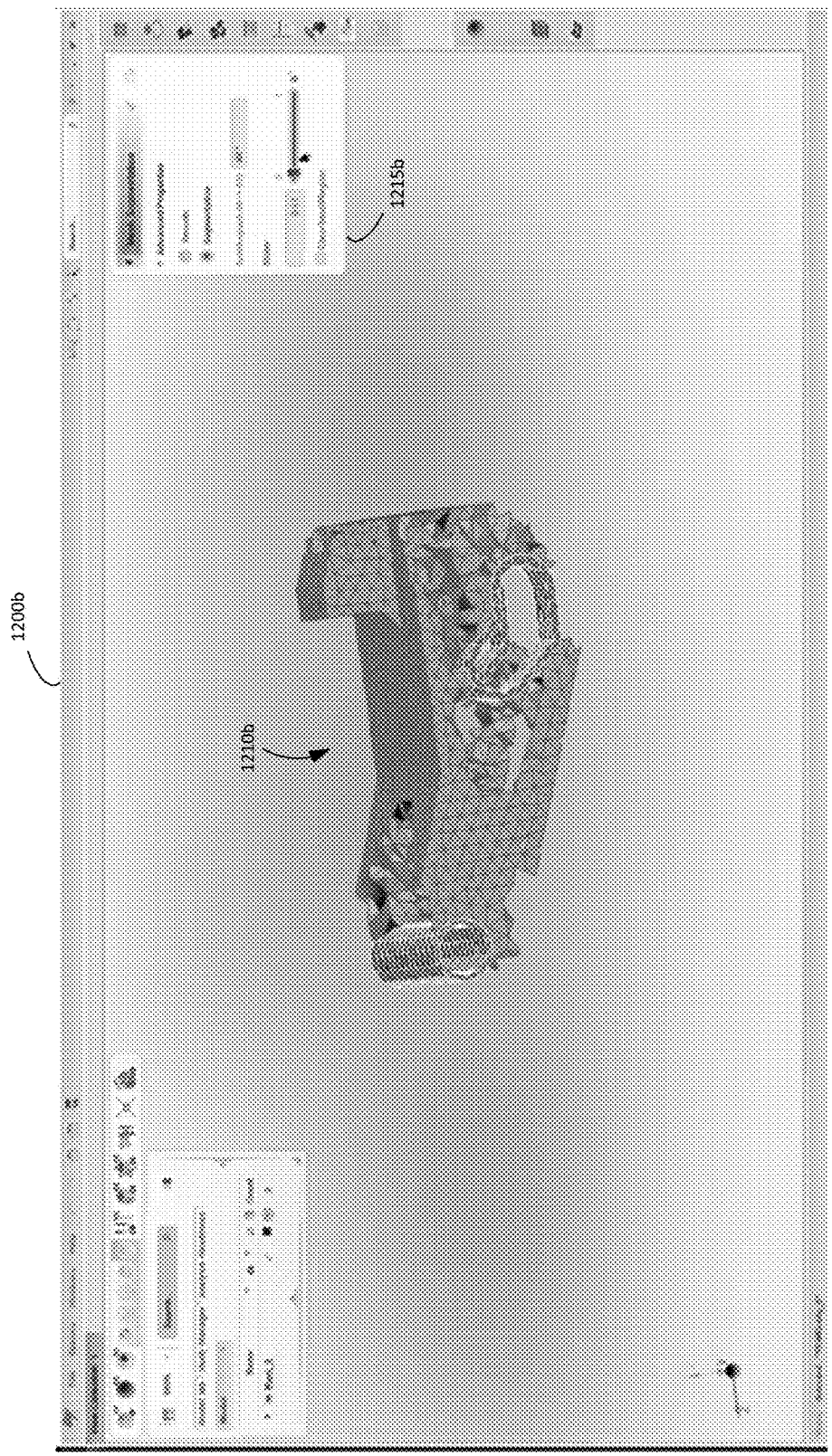
FIG. 12B is an example of a display screen interface showing a mesh model according to various embodiments.
Figure 12C:
FIG. 12C is an example of a display screen interface showing a mesh model according to various embodiments.

FIG. 12A is an example of a display screen interface 1200a showing a mesh model 1210a according to various embodiments. Referring to FIGS. 1-12A, the mesh model 1210a may be obtained at the block B210a. FIG. 12B is an example of a display screen interface 1200b showing a mesh model 1210b according to various embodiments. FIG. 12C is an example of a display screen interface 1200c showing a mesh model 1210c according to various embodiments. Referring to FIGS. 1-12C, the mesh models 1210a, 1210b, 1210c may correspond to one another. The mesh models 1210b and 1210c may be associated with elements (of the mesh model 1210*a*) and the features identified at the block B220*a* and/or with the method 200*b*.

A segmentation interface (e.g., the segmentation interfaces 1215*b*, 1215*c*, which correspond to one another) may be provided to adjust the preferred segmentation sizes of the identified features. In some embodiments, the segmentation interfaces 1215*b*, 1215*c* may each include a sliding bar for adjusting the preferred segmentation sizes. In other embodiments, other suitable interfaces may be implemented for adjusting the preferred segmentation sizes. The preferred segmentation sizes may refer to a maximum or preferred dimensions for each of the identified features. Larger preferred segmentation size may correspond to larger identified features. Smaller preferred segmentation size may cause breaks or segments between two or more features that would have been identified as a same feature when the preferred segmentation size is sufficiently large.

Illustrating with a non-limiting example, a 4 cm-by-8 cm surface feature may be identified as a same surface feature when the preferred segmentation dimensions (or area) are equal to or greater than 4 cm-by-8 cm (or 32 cm$^2$). When the preferred segmentation dimensions (or area) are equal to 4 cm-by-4 cm (or 16 cm$^2$), the 4 cm-by-8 cm surface feature may be segmented into two 4 cm-by-4 cm surface features. In further embodiments, larger preferred segmentation size may also correspond to higher angle range. For example, a larger preferred segmentation size may correspond to grouping outer surfaces (of elements) at angles within a first range (e.g., within 179°-181°) while a smaller preferred segmentation size may correspond to grouping outer surfaces (of elements) at angles within a second range (e.g., within 179.5°-180.5°). The first range is greater than the second range.

Figure 12D:
FIG. 12D is an example of a display screen interface showing a mesh model according to various embodiments.

FIG. 12D is an example of a display screen interface 1200*d* showing a mesh model 1210*d* according to various embodiments. Referring to FIGS. 1-12D, the mesh model 1210*d* may correspond to the mesh models 1210*a*-1210*c*. After appropriate feature identification and preferred segmentation size selection at the interfaces 1200*b*, 1200*c*, the user may select a portion of the mesh model 1210*d* for manipulation. For example, the user may select a selected feature (e.g., a surface feature 1220*d*) with a mouse cursor 1230*d* (or other suitable selection tool provided by the interface 160).

Figure 12E:
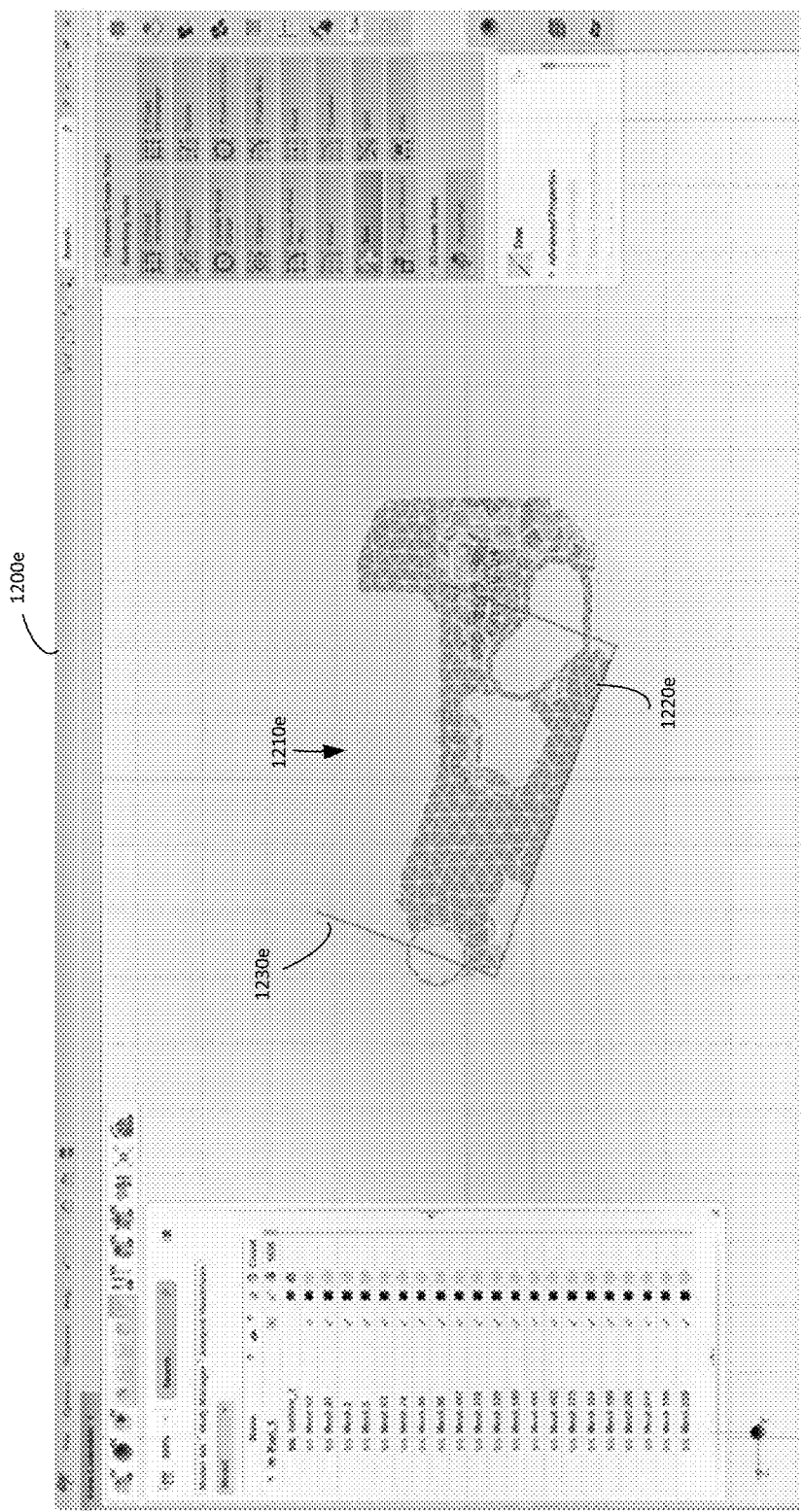
FIG. 12E is an example of a display screen interface showing a mesh model according to various embodiments.

FIG. 12E is an example of a display screen interface 1200*e* showing a mesh model 1210*e* according to various embodiments. Referring to FIGS. 1-12E, the mesh model 1210*e* may correspond to the mesh models 1210*a*-1210*d*. After selecting the surface feature 1220*d* at the interface 1200*d*, the user may manipulate the surface feature 1220*d* (corresponding to a surface feature 1220*e*) at the block B230*a* and/or with the method 800*d*. For example, the display screen interface 1200*e* may provide push/pull operations for manipulating the dimensions of the surface feature 1220*e*. The push/pull operations may be implemented with a box 1230*e*. Pushing and pulling the sides of the box 1230*e* may manipulate the corresponding dimensions of the surface feature 1220*e* (at the block B820*d*) for generating modified boundaries (at the block B830*d*).

Figure 12F:
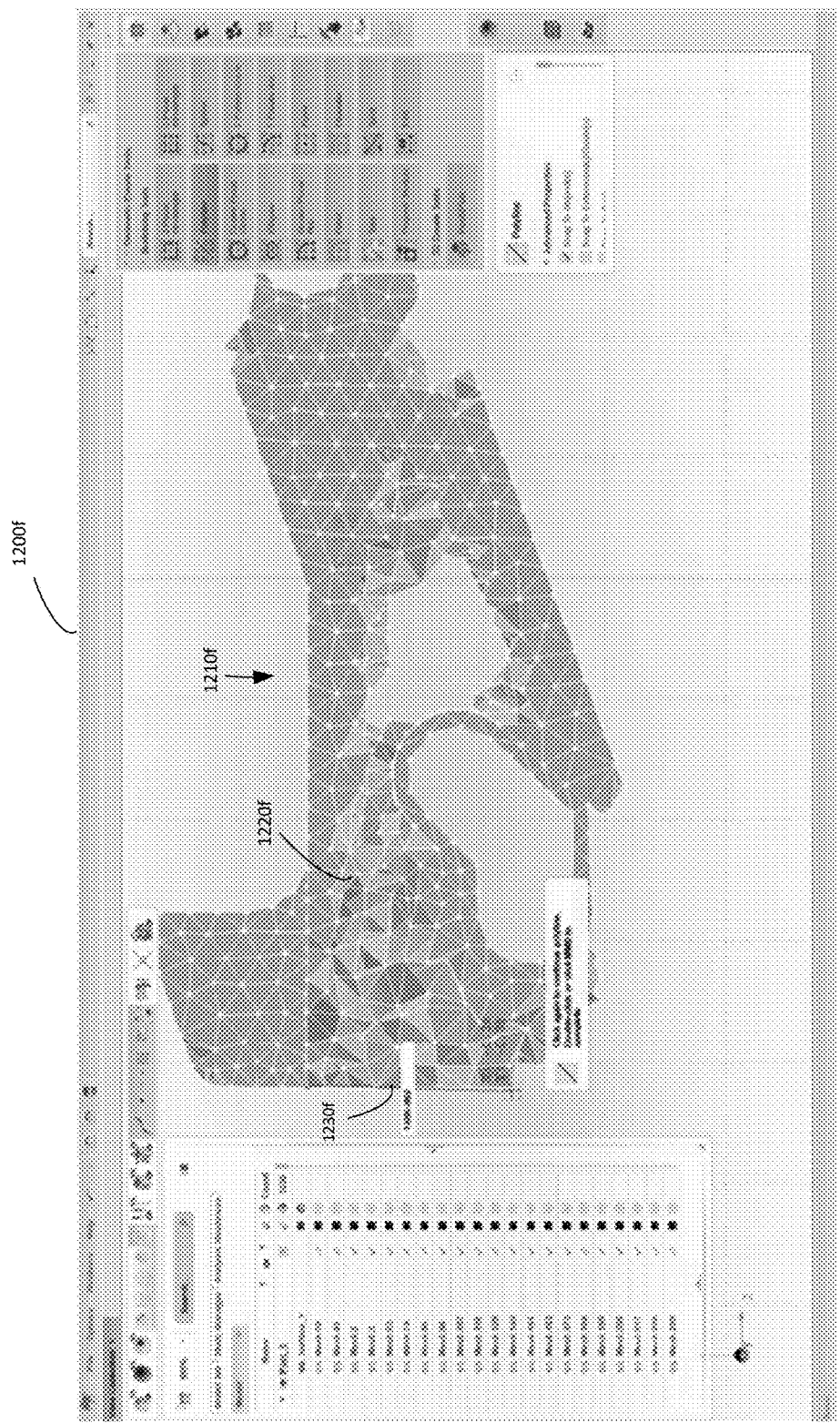
FIG. 12F is an example of a display screen interface showing a mesh model according to various embodiments.

FIG. 12F is an example of a display screen interface 1200*f* showing a mesh model 1210*f* according to various embodiments. Referring to FIGS. 1-12F, the mesh model 1210*f* may correspond to the mesh models 1210*a*-1210*e*. A surface element 1220*f* may be selected in the same manner as the surface feature 1220*d* may be selected, for manipulation at the block B230*a* and/or with the method 800*d*. For example, the display screen interface 1200*f* may provide a line tool 1230*f* for specifically indicating desired boundary dimensions for the surface element 1220*f*. The user may indicate the desired boundary dimensions by specifying a line (e.g., by setting beginning and end points) with the line tool 1230*f*. The modified boundaries may be generated (at the block B830*d*) according to the line indicated (at the block B820*d*). With respect to the surface element 1220*f*, which is a positive feature, extra elements or enlarged existing elements may be generated/regenerated (at the block B840*d*) to occupy a new area created by a pull operation while elements may be deleted or shrunk (at the block B840*d*) to clear an area deleted by a push operation.

Figure 12G:
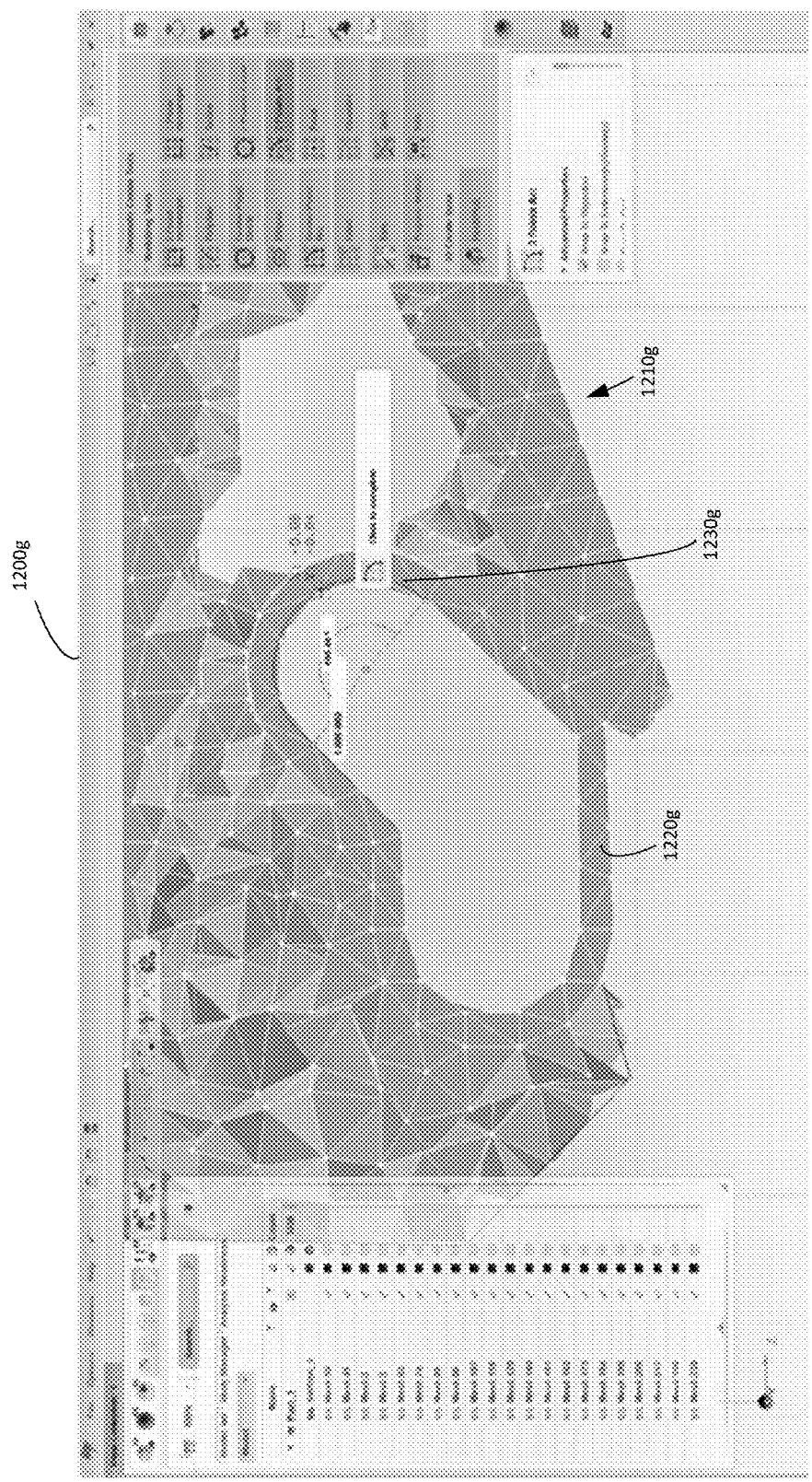
FIG. 12G is an example of a display screen interface showing a mesh model according to various embodiments.

FIG. 12G is an example of a display screen interface 1200*g* showing a mesh model 1210*g* according to various embodiments. Referring to FIGS. 1-12G, the mesh model 1210*g* may correspond to the mesh models 1210*a*-1210*f*. A hole feature 1220*g* may be selected in the same manner as the surface feature 1220*d* may be selected, for manipulation at the block B230*a* and/or with the method 800*d*. For example, the display screen interface 1200*g* may provide an arc line tool 1230*g* for specifically indicating desired boundary dimensions for the hole feature 1220*g*. The user may indicate the desired boundary dimensions by specifying an arc (e.g., by setting beginning point, end point, and curvature) with the arc line tool 1230*g*. The modified boundaries may be generated (at the block B830*d*) according to the arc indicated (at the block B820*d*). With respect to the hole feature 1220*g*, which is a negative feature, extra elements or enlarged existing elements may be generated/regenerated (at the block B840*d*) to occupy a deleted area created by a push operation while elements may be deleted or shrunk (at the block B840*d*) to clear an area generated by a push operation.

Figure 12H:
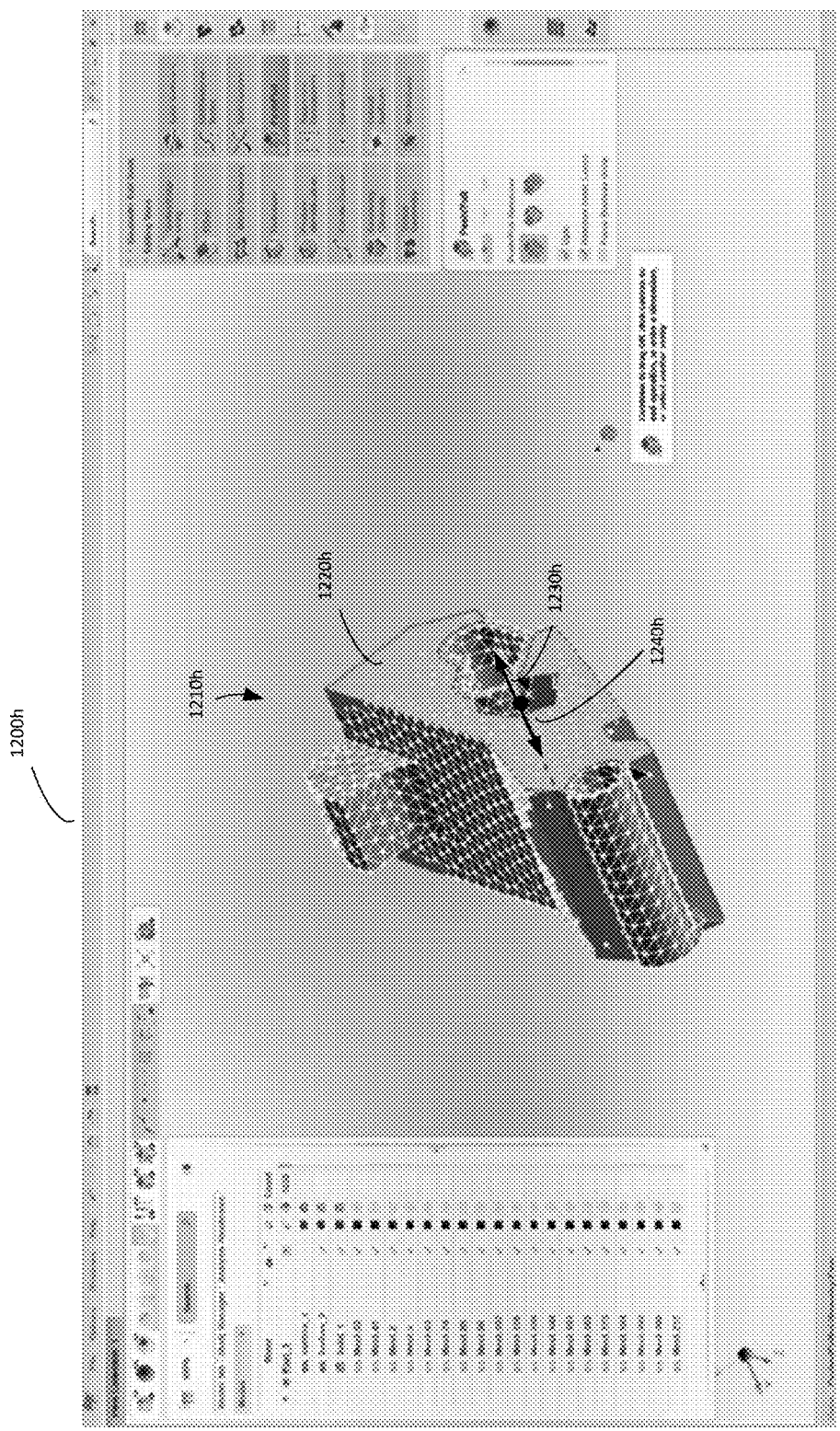
FIG. 12H is an example of a display screen interface showing a mesh model according to various embodiments.

FIG. 12H is an example of a display screen interface 1200*h* showing a mesh model 1210*h* according to various embodiments. Referring to FIGS. 1-12H, the mesh model 1210*h* may correspond to the mesh models 1210*a*-1210*g*. A surface element 1220*h* may be selected in the same manner as the surface feature 1220*d* may be selected, for manipulation at the block B230*a* and/or with the method 800*d*. For example, the surface element 1220*h* may be moved (e.g., repositioned) by being dragged (with a mouse implemented with the interface) in any suitable direction. In further embodiments, predetermined or suggested directions (e.g., direction indicators 1230*h*, 1240*h*) may be displayed by the interface 160. In response to user selection, the surface element 1220*h* may be moved based on the selected direction indicator. The modified boundaries may be generated (at the block B830*d*) according to the moved surface element 1200*h* (at the block B820*d*).

Figure 12I:
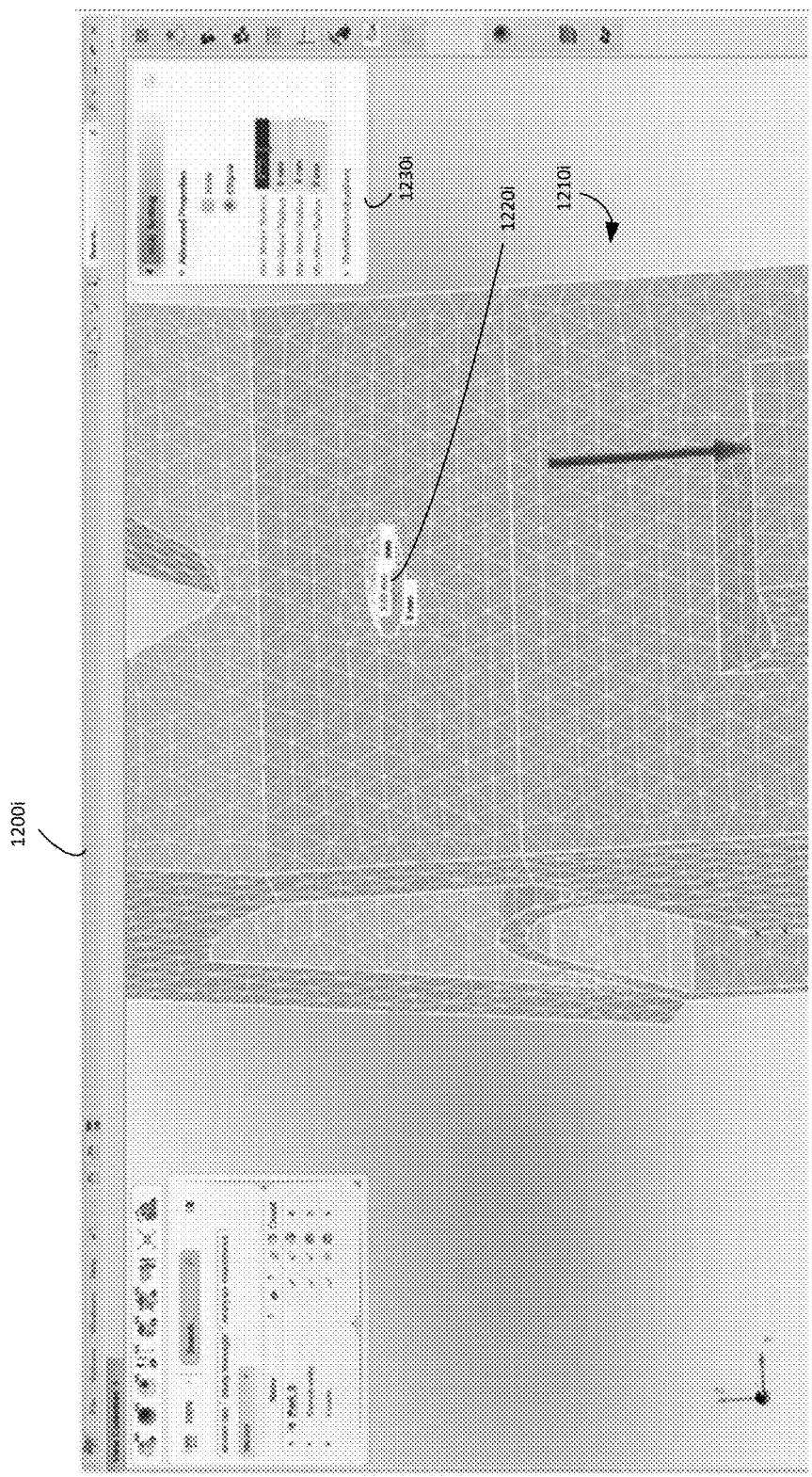
FIG. 12I is an example of a display screen interface showing a mesh model according to various embodiments.
Figure 12J:
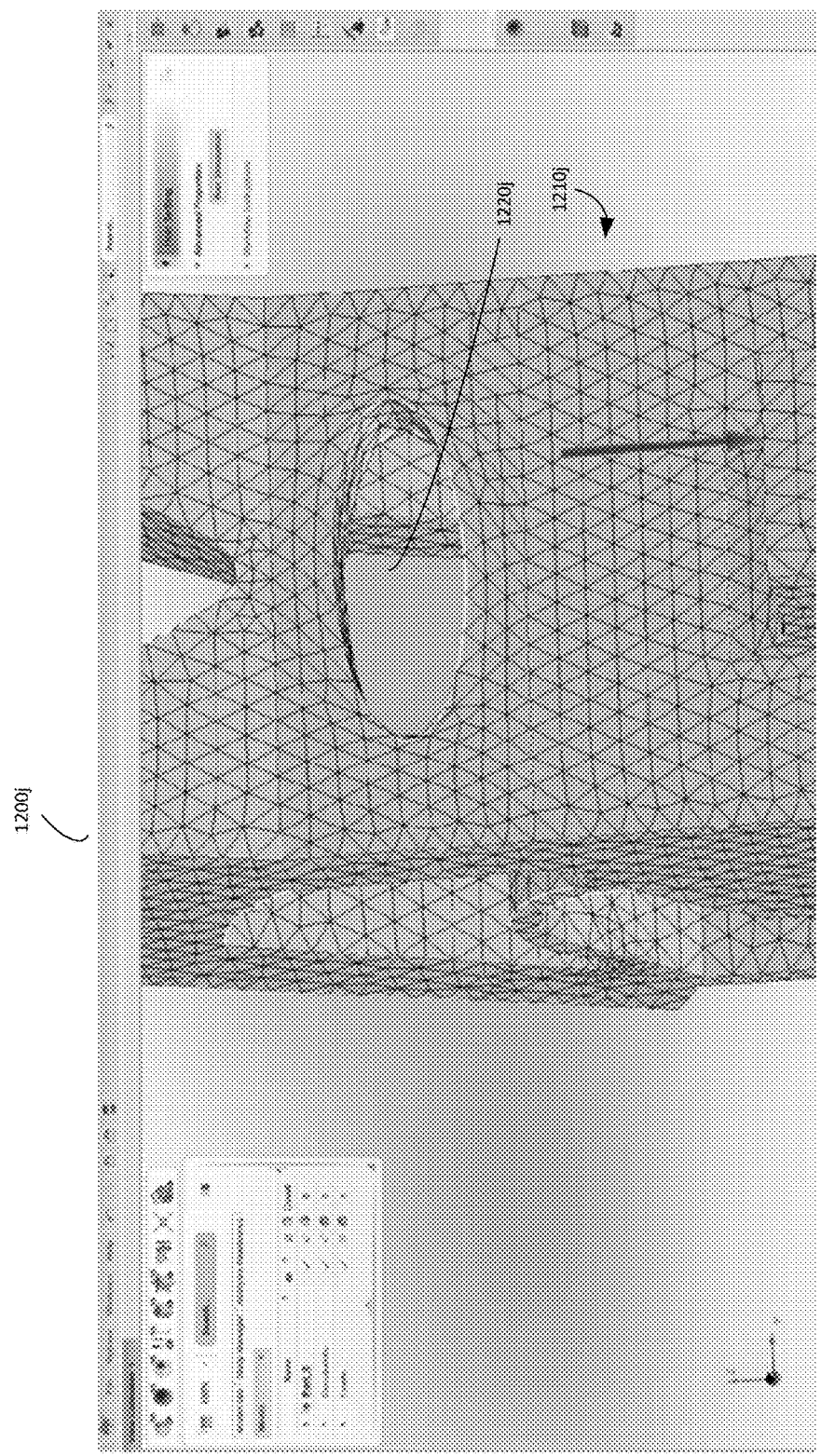
FIG. 12J is an example of a display screen interface showing a mesh model according to various embodiments.

FIG. 12I is an example of a display screen interface 1200*i* showing a mesh model 1210*i* according to various embodiments. Referring to FIGS. 1-12I, the mesh model 1210*i* may correspond to the mesh models 1210*a*-1210*h*. A hole feature 1220*i* may be selected in the same manner as the surface feature 1220*d* may be selected, for manipulation at the block B230*a* and/or with the method 800*d*. For example, the hole feature 1220*i* may be resized corresponding to desired dimensions inputted by the user with a resize panel 1230*i* provided by the interface 160. In other embodiments, the hole feature 1220*i* may be resized in other suitable manners such as, but not limited to, dragging a size indicator corresponding to the desired dimensions of the feature. FIG. 12J is an example of a display screen interface 1200*j* showing a mesh model 1210*j* according to various embodiments. The modified boundaries may be generated (at the block B830*d*) according to resized hole feature 1220*i* (at the block B820*d*). Referring to FIGS. 1-12J, the mesh model 1210*j* may correspond to the mesh models 1210a-1210i. A hole feature 1220j of the mesh model 1210j may correspond to the hole feature 1220i. In particular, the hole feature 1220j shows a resized (enlarged) version of the hole feature 1220i.

Tools used to manipulate the features include, but not limited to, a two-point rectangle, three-point rectangle, polyline, spline, center-point circle, two-point circle, ellipse, three-point arc, center-point arc, point, fillet, chamfer, trim, split, push, pull, selection, a combination thereof, and/or the like.

Accordingly, direct modeling as enabled for FEM can empower the user to define and capture the geometry of the mesh model quickly and efficiently, without having to worry about features, constraints, and original design intent. Therefore, modeling efficiency can be improved with direct modeling. Parametric modeling may allow the user to capture design intent using features and constraints, enabling automated and repetitive changes, such as those used in families of product parts.

In some embodiments, the feature manipulation module 120 may be configured to fix two or more features. For example, the feature manipulation module 120 may detect a (2-dimensional or 3-dimensional) gap between two or more separate features identified. The gap may be characterized by a lack of elements therein. The gap may be detected when the size of the gap crosses predetermined threshold size. Next, the feature manipulation module 120 may fill the gap between the features (e.g., by generating elements in the gap).

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions may be executed on any type of computing device (e.g., computer, laptop, etc.) or may be embedded on any type of electronic device (e.g., a portable storage device such as a flash drive, etc.).

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for extending direct modeling to a Finite Element Analysis (FEA)-based computer simulation platform, comprising:
    obtaining a mesh model of a physical object, the mesh model comprising a plurality of finite elements, wherein the mesh model is an orphan mesh model without any geometry attached therewith and without a non-uniform rational basis spline (NURBS);
    determining, based on at least some of the plurality of finite elements, at least one feature associated with the at least some of the plurality of finite elements of the mesh model based on angles between surfaces of the plurality of finite elements;
    receiving, via an input device of the FEA-based computer simulation platform, user input corresponding to virtually pushing or pulling the at least one feature to cause geometric manipulations to the at least one feature, wherein the at least one feature comprises the at least some of the plurality of finite elements; and
    geometrically manipulating the at least some of the plurality of finite elements of the mesh model as a whole according to the geometric manipulations to the at least one feature caused by the user input, wherein the mesh model remains the orphan mesh model without the geometry attached therewith and without the NURBS as it is being geometrically manipulated, and geometrically manipulating the at least some of the plurality of finite elements comprises generating a modified boundary for the at least some of the plurality of finite elements of the mesh model based on the user input.

2. The method of claim 1, wherein the geometric manipulations comprise at least one of virtually reorienting, repositioning, resizing, performing Boolean operations, or filling the at least one feature.

3. The method of claim 2, wherein the determining of the at least one feature comprises:
identifying that the at least some of the plurality of finite elements is associated with the at least one feature based on predetermined rules;
classifying the at least one feature; and
organizing the at least one feature when the at least one feature is determined to be appropriately suggested or identified.

4. The method of claim 1, further comprises displaying the at least one feature associated with the mesh model via a user interface to a user.

5. The method of claim 1, further comprises displaying the at least one feature associated with the mesh model and the plurality of finite elements simultaneously via a user interface to a user.

6. The method of claim 1, wherein the determining of the at least one feature comprises:
identifying that the at least some of the plurality of finite elements is associated with the at least one feature based on predetermined rules;
classifying the at least one feature; and
organizing the at least one feature when the at least one feature is determined to be appropriately suggested or identified.

7. The method of claim 6, wherein the at least one feature is determined to be appropriately suggested or identified based on additional user input.

8. The method of claim 1, wherein receiving the user input comprises:
receiving first user input corresponding to selection of one of the at least one feature;
receiving second user input corresponding to manipulative interaction with the selected feature; and geometrically manipulating the at least some of the plurality of finite elements comprises
generating the modified boundary based on the manipulative interaction; and
regenerating the plurality of finite elements based on the modified boundary.

9. The method of claim 8, wherein the manipulative interaction comprises at least one of virtually pushing, pulling, reorienting, repositioning, resizing, performing Boolean operations, or filling the selected feature.

10. The method of claim 1, further comprises displaying a first interface having the at least one feature and displaying a second interface having a copy of the at least one feature, wherein:
the copy of the at least one feature is manipulated in the second interface; and
the first interface and the second interface are displayed simultaneously.

11. The method of claim 1, further comprises determining the at least one feature having a size corresponding to a preferred segmentation size.

12. The method of claim 1, wherein the determining of the at least one feature based on the angles between surfaces of the plurality of finite elements comprises:
determining outer surfaces for two or more of the plurality of finite elements; and
identifying the outer surfaces of the two or more of the at least some of the plurality of finite elements to be a same feature based on an angle between the outer surfaces.

13. The method of claim 12, wherein at least a portion of each of the outer surfaces is free from contacting surface of another finite element.

14. The method of claim 1, further comprises:
determining, based on additional user input, whether the at least one feature is appropriately identified; and
determining at least one different feature when the at least one feature is determined to be inappropriately identified.

15. The method of claim 14, wherein the determining of the at least one different feature comprises combining two or more previously identified features based on additional user input.

16. The method of claim 1, wherein the at least one feature is a surface comprising surfaces of the plurality of finite elements.

17. The method of claim 1, wherein the at least one feature is a volume comprising volumes of the plurality of finite elements.

18. A system extending direct modeling to a Finite Element Analysis (FEA)-based computer simulation platform, comprising:
an interface;
a processor configured to:
obtain a mesh model of a physical object, the mesh model comprising a plurality of finite elements, wherein the mesh model is an orphan mesh model without any geometry attached therewith and without a non-uniform rational basis spline (NURBS);
determine, based on at least some of the plurality of finite elements, at least one feature associated with the at least some of the plurality of finite elements of the mesh model based on angles between surfaces of the plurality of finite elements;
receive, via an input device of the FEA-based computer simulation platform, user input corresponding to virtually pushing or pulling the at least one feature to cause geometric manipulations to the at least one feature, wherein the at least one feature comprises the at least some of the plurality of finite elements; and
geometrically manipulate the at least some of the plurality of finite elements of the mesh model as a whole according to the geometric manipulations to the at least one feature caused by the user input, wherein the mesh model remains the orphan mesh model without the geometry attached therewith and without the NURBS as it is being geometrically manipulated, and geometrically manipulating the at least some of the plurality of finite elements comprises generating a modified boundary for the at least some of the plurality of finite elements of the mesh model based on the user input.

19. A non-transitory processor readable storage media storing a program that when executed in a processor of a device causes the processor to perform a method extending direct modeling to a Finite Element Analysis (FEA)-based computer simulation platform, the method comprising:

obtaining a mesh model of a physical object, the mesh model comprising a plurality of finite elements, wherein the mesh model is an orphan mesh model without any geometry attached therewith and without a non-uniform rational basis spline (NURBS);

determining, based on at least some of the plurality of finite elements, at least one feature associated with the at least some of the plurality of finite elements of the mesh model based on angles between surfaces of the plurality of finite elements;

receiving, via an input device of the FEA-based computer simulation platform, user input corresponding to virtually pushing or pulling the at least one feature to cause geometric manipulations to the at least one feature, wherein the at least one feature comprises the at least some of the plurality of finite elements; and geometrically manipulating the at least some of the plurality of finite elements of the mesh model as a whole according to the geometric manipulations of the at least one feature caused by the user input, wherein the mesh model remains the orphan mesh model without the geometry attached therewith and without the NURBS as it is being geometrically manipulated, and geometrically manipulating the at least some of the plurality of finite elements comprises generating a modified boundary for the at least some of the plurality of finite elements of the mesh model based on the user input.

\* \* \* \* \*